(12) United States Patent
Amano et al.

(10) Patent No.: US 7,348,659 B2
(45) Date of Patent: Mar. 25, 2008

(54) SEMICONDUCTOR DEVICE AND METHOD OF MANUFACTURING THEREOF

(75) Inventors: Kenji Amano, Kamiiso (JP); Atsushi Fujisawa, Hakodate (JP); Hajime Hasebe, Hakodate (JP)

(73) Assignees: Renesas Technology Corp., Tokyo (JP); Renesas Northern Japan Semiconductor, Inc., Hokkaido (JP)

( * ) Notice: Subject to any disclaimer, the term of this patent is extended or adjusted under 35 U.S.C. 154(b) by 148 days.

(21) Appl. No.: 10/878,226

(22) Filed: Jun. 29, 2004

(65) Prior Publication Data
US 2005/0029640 A1 Feb. 10, 2005

(30) Foreign Application Priority Data
Aug. 5, 2003 (JP) ............................. 2003-286609

(51) Int. Cl.
*H01L 23/495* (2006.01)
(52) U.S. Cl. ........................................ 257/666; 257/735
(58) Field of Classification Search ................ 257/735, 257/666, 670, 673; 438/123; 361/813
See application file for complete search history.

(56) References Cited

U.S. PATENT DOCUMENTS 6,713,849 B2 * 3/2004 Hasebe et al. ............. 257/667

2002/0109242 A1 * 8/2002 Kasuga et al. ............. 257/787
2003/0006055 A1 * 1/2003 Chien-Hung et al. ...... 174/52.1

FOREIGN PATENT DOCUMENTS

JP 2001-24133 1/2001

* cited by examiner

*Primary Examiner*—Tuan H. Nguyen
(74) *Attorney, Agent, or Firm*—Antonelli, Terry, Stout & Kraus, LLP.

(57) ABSTRACT

A semiconductor chip is mounted on a tab, leads alternately arranged around the tab are electrically connected to electrodes of the semiconductor chip via bonding wires, and encapsulating resin encapsulates the semiconductor chip and bonding wires. The lower surfaces of the leads are exposed at the outer periphery of the back surface of the encapsulating resin to form external terminals. The lower surfaces of the leads are exposed at the back surface of the encapsulating resin located inwardly of the lower exposed surface of the leads to form external terminals. The cut surfaces of the leads are exposed at the cut surfaces of the encapsulating resin, while upper exposed surfaces of the leads are exposed from the encapsulating resin portion which is proximate to the cut surfaces thereof. Each of the upper exposed surfaces of the leads has a width smaller than the width of each of the lower exposed surfaces.

2 Claims, 23 Drawing Sheets

SEMICONDUCTOR DEVICE AND METHOD OF MANUFACTURING THEREOF

CROSS-REFERENCE TO RELATED APPLICATION

The present application claims priority from Japanese Patent Application JP 2003-286609, filed on Aug. 5, 2003, the content of which is hereby incorporated by reference into this application.

BACKGROUND OF THE INVENTION

The present invention relates to a semiconductor device, and, more particularly, the present invention relates to a technique which is effective when applied to a semiconductor device having a QFN (Quad Flat Non-leaded) package configuration.

Semiconductor devices which have a QFN (Quad Flat Non-leaded) package configuration are manufactured by mounting individual semiconductor chips on respective die pad portions (tabs) of a lead frame, wire bonding the lead portions of the lead frame to electrodes on respective surfaces of the semiconductor chips, performing resin mold encapsulation, and then cutting the lead frame into individual pieces. At the respective mounting surfaces of the semiconductor devices, each of which has in a QFN package configuration, the lead portions of the lead frame are partly exposed from the encapsulating resin so as to serve as external terminals.

Japanese Laid-Open Patent Application No. 2001-24133 discloses a lead frame which has die pad portions, each for mounting a semiconductor element within a frame body composed of a metal plate; suspended lead portions having terminal ends connected to the frame body and tip end portions for supporting a die pad portion; and land lead portions and lead portions disposed to have the tip end portions opposing the die pad portion and terminal end portions connected to the frame body. The land lead portions and the lead portions have respective bottom surfaces which form external terminals. The die pad portion has an opening in a generally central portion thereof, a plurality of support portions upwardly protruding in the open region to support a semiconductor element at the bottom surfaces thereof, and a coupling portion for coupling the plurality of support portions to each other (see Patent Document 1).

[Patent Document 1] Japanese Laid-Open Patent Application No. 2001-24133

SUMMARY OF THE INVENTION

In recent years, there has been an increasing demand for improvement in the reliability of a semiconductor device in a semiconductor package configuration. In a semiconductor device in, e.g., a QFN package configuration, the spacings between leads have been reduced as the semiconductor device has been increasingly miniaturized and equipped with a larger number of terminals, so that a short circuit is more likely to occur between the leads. As a result of investigation, the present inventors have found that a short circuit is likely to occur between the respective portions of the upper surfaces of leads which are exposed from an encapsulating resin. There are also cases where, when a semiconductor device in a semiconductor package configuration is mounted on a substrate, the substrate or the semiconductor device repeatedly undergoes warping due to temperature variations in an ambient environment, so that the mounting portion of the semiconductor comes off the substrate. Therefore, there has been a desire to improve the reliability of the semiconductor device and the reliability with which the semiconductor device is mounted on the substrate.

An object of the present invention is to provide a semiconductor device in which the reliability thereof can be improved, and a method of manufacture thereof.

The above and other objects and novel features of the present invention will become apparent from the description provided in the present specification and from the accompanying drawings.

The following is a brief description of representative aspects of the present invention disclosed in the present application.

A semiconductor device according to the present invention has a semiconductor chip mounted on a chip mounting portion, a plurality of first lead portions and a plurality of second lead portions, which are alternately arranged around the chip mounting portion and are electrically connected to the semiconductor chip via wires, and an encapsulating resin portion for encapsulating therein the chip mounting portion, the semiconductor chip, the first and second lead portions, and the wires. In such an arrangement, the respective lower surfaces of the individual first lead portions are exposed at the peripheral region of the mounting surface of the encapsulating resin portion; the respective lower surfaces of the individual second lead portions are exposed at the portion of the mounting surface of the encapsulating resin portion, which is located inward of the first lead portions; and the portions of the respective upper surfaces of the first lead portions, which are exposed from the encapsulating resin portion, have widths smaller than those of the portions of the respective lower surfaces of the first lead portions, which are exposed at the mounting surface of the encapsulating resin portion.

Alternatively, the semiconductor device according to the present invention has a semiconductor chip mounted on a chip mounting portion, a plurality of first lead portions and a plurality of second lead portions, which are alternately arranged around the chip mounting portion and are electrically connected to the semiconductor chip via wires, and an encapsulating resin portion for encapsulating therein the chip mounting portion, the semiconductor chip, the first and second lead portions, and the wires. In this arrangement, the respective lower surfaces of the individual first lead portions are exposed at the peripheral region of the mounting surface of the encapsulating resin portion; the respective lower surfaces of the individual second lead portions are exposed at the portion of the mounting surface of the encapsulating resin portion, which is located inward of the first lead portions; and the portion of the lower surface of each of the first lead portions, which is exposed at the mounting surface of the encapsulating resin portion, has an area larger than that of the portion of the lower surface of each of the second lead portions, which is exposed at the mounting surface of the encapsulating resin portion.

Alternatively, the semiconductor device according to the present invention has a semiconductor chip mounted on a chip mounting portion, a plurality of first lead portions and a plurality of second lead portions, which are alternately arranged around the chip mounting portion and are electrically connected to the semiconductor chip via wires, and an encapsulating resin portion for encapsulating therein the chip mounting portion, the semiconductor chip, the first and second lead portions, and the wires. In this arrangement, the respective lower surfaces of the individual first lead portions are exposed at the peripheral region of the mounting surface of the encapsulating resin portion; the respective lower surfaces of the individual second lead portions are exposed at the portion of the mounting surface of the encapsulating resin portion which is located inward of the first lead portions; and the respective upper surfaces of the first lead portions are not exposed from the encapsulating resin portion.

Alternatively, the semiconductor device according to the present invention has a semiconductor chip mounted on a chip mounting portion, a plurality of first lead portions and a plurality of second lead portions, which are alternately arranged around the chip mounting portion and are electrically connected to the semiconductor chip via wires, a plurality of conductor portions having respective end portions connected to the chip mounting portion and extending outwardly of the chip mounting portion, and an encapsulating resin portion for encapsulating therein the chip mounting portion, the semiconductor chip, the first and second lead portions, the wires, and the conductor portions. In this arrangement, the respective lower surfaces of the individual first lead portions are exposed at the peripheral region of the mounting surface of the encapsulating resin portion; the respective lower surfaces of the individual second lead portions are exposed at the portion of the mounting surface of the encapsulating resin portion, which is located inward of the first lead portions; the respective lower surfaces of the individual conductor portions are exposed at the mounting surface of the encapsulating resin portion; and the respective surfaces of the first and second lead portions and the conductor portions, which are exposed at the mounting surface of the encapsulating resin portion, are connected to a substrate when the semiconductor device is mounted on the substrate.

Alternatively, the semiconductor device according to the present invention has a semiconductor chip mounted on a chip mounting portion, a plurality of lead portions arranged around the chip mounting portion and electrically connected to the semiconductor chip via wires, a plurality of conductor portions having respective end portions connected to the chip mounting portion and extending outwardly of the chip mounting portion, and an encapsulating resin portion for encapsulating therein the chip mounting portion, the semiconductor chip, the lead portions, the wires, and the conductor portions. In this arrangement, the respective lower surfaces of the individual lead portions are exposed at the mounting surface of the encapsulating resin portion and the lower surface of each of the conductor portions has a plurality of portions exposed at the mounting surface of the encapsulating resin portion.

A method of manufacturing a semiconductor device according to the present invention is employed for manufacturing a semiconductor device in a QFN package configuration by using a lead frame having a palladium plate layer formed on the surface thereof.

Alternatively, the method of manufacturing a semiconductor device in a QFN package configuration, according to the present invention, includes the steps of mounting a semiconductor chip on the chip mounting portion of a lead frame, electrically connecting the lead portions of the lead frame to the semiconductor chip via wires, forming an encapsulating resin portion for encapsulating therein the chip mounting portion, the semiconductor chip, the lead portions, and the wires, cutting the lead frame, and then forming the plate layer over the respective portions of the lead portions which are exposed from the encapsulating resin portion.

Alternatively, the method of manufacturing a semiconductor device in a QFN package configuration, according to the present invention, includes the steps of mounting a semiconductor chip on the chip mounting portion of the lead frame, electrically connecting the lead portions of the lead frame to the semiconductor chip via wires, forming an encapsulating resin portion for encapsulating therein the chip mounting portion, the semiconductor chip, the lead portions, and the wires, forming the plate layer on the principal surface of the lead frame opposite to the principal surface thereof on which the encapsulating resin portion is formed, and then cutting the lead frame.

The following is a brief description of effects obtainable from the representative aspects of the present invention disclosed in the present application.

In a semiconductor device having a semiconductor chip mounted on a chip mounting portion, a plurality of first lead portions and a plurality of second lead portions, which are alternately arranged around the chip mounting portion and are electrically connected to the semiconductor chip via the wires, and an encapsulating resin portion for encapsulating therein the chip mounting portion, the semiconductor chip, the first and second lead portions, and the wires, the respective lower surfaces of the individual first lead portions are exposed at the peripheral region of the mounting surface of the encapsulating resin portion, and the respective lower surfaces of the individual second lead portions are exposed at the portion of the mounting surface of the encapsulating resin portion which is inward of the first lead portions. In addition, the width of the portion of the upper surface of each of the first lead portions, which is exposed from the encapsulating resin portion, is adjusted to be smaller than that of the portion of the lower surface of the first lead portion, which is exposed at the mounting surface of the encapsulating resin portion. As a result, the reliability of the semiconductor device is improved.

In a semiconductor device having a semiconductor chip mounted on the chip mounting portion, a plurality of first lead portions and a plurality of second lead portions, which are alternately arranged around the chip mounting portion and are electrically connected to the semiconductor chip via the wires, and an encapsulating resin portion for encapsulating therein the chip mounting portion, the semiconductor chip, the first and second lead portions, and the wires, the respective lower surfaces of the individual first lead portions are exposed at the peripheral region of the mounting surface of the encapsulating resin portion, and the respective lower surfaces of the individual second lead portions are exposed at the portion of the mounting surface of the encapsulating resin portion, which is located inward of the first lead portions. In addition, the area of the portion of the lower surface of each of the first lead portions, which is exposed from the mounting surface of the encapsulating resin portion, is adjusted to be larger than that of the portion of the lower surface of each of the second lead portions, which is exposed at the mounting surface of the encapsulating resin portion. As a result, the semiconductor device is mounted on a substrate with improved reliability.

In a semiconductor device having a semiconductor chip mounted on a chip mounting portion, a plurality of lead portions arranged around the chip mounting portion and electrically connected to the semiconductor chip via the wires, a plurality of conductor portions having the respective end portions thereof connected to the chip mounting portion and extending outwardly of the chip mounting portion, and an encapsulating resin portion for encapsulating therein the chip mounting portion, the semiconductor chip, the lead portions, the wires, and the conductor portions, the respective lower surfaces of the individual lead portions are exposed at the mounting surface of the encapsulating resin portion, and the lower surface of each of the conductor portions has a plurality of portions exposed at the mounting surface of the encapsulating resin portion, so that the semiconductor device is mounted on the substrate with improved reliability.

DETAILED DESCRIPTION OF THE PREFERRED EMBODIMENTS

Figure 1:
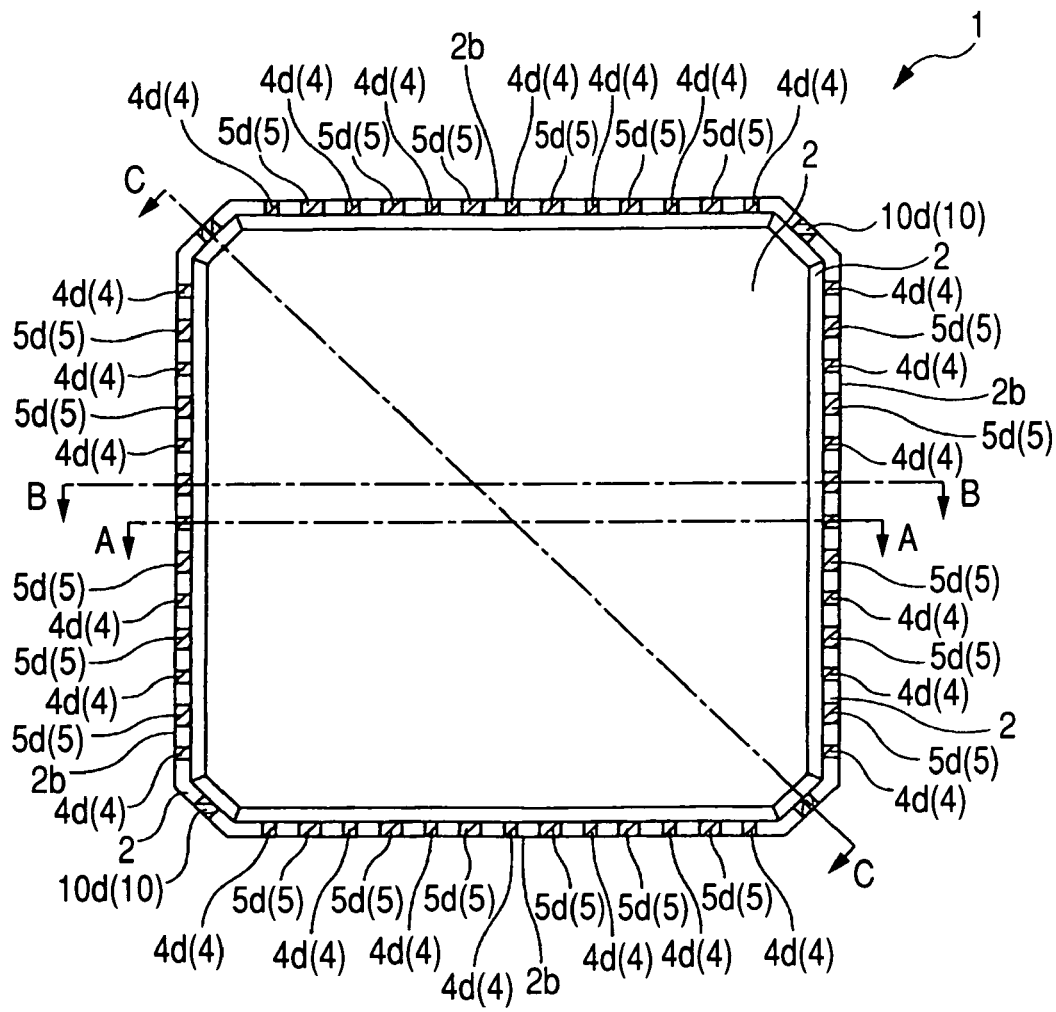
FIG. 1 is a top plan view of a semiconductor device according to an embodiment of the present invention.

The following is the description of various embodiments of the present invention in which the subject matter of the embodiments may be divided into a plurality of sections, if necessary for convenience. However, the divided sections of the subject matter are by no means irrelevant to each other, unless indicated particularly and explicitly to be so, but are mutually related to each other such that one of the sections may constitute a variation or a detailed or complementary description of some or all of the others. If a number and the like of elements (including the number, numerical value, amount, and range thereof) are referred to in the following description of the embodiments, the invention is not to be limited to specific numbers, unless indicated particularly and explicitly to be so or unless it is obviously limited to specific numbers in principle. The number and the like of elements may be not less than or not more than specific numbers. It will easily be appreciated that, in the following description of the embodiments, the components thereof (including also elements and steps) are not necessarily indispensable, unless shown particularly and explicitly to be so or unless the components are obviously indispensable. Likewise, if certain configurations, a positional relationship, and the like of the components are referred to in the following description of the embodiments, the configurations and the like are assumed to include those substantially proximate or similar thereto, unless indicated particularly and explicitly to the contrary or unless obviously they are not in principle. The same shall apply to the foregoing numeric values and the range.

A detailed description will be given herein of various embodiments of the present invention with reference to the drawings. Throughout the drawings, components having the same functions are designated by the same reference numerals and a repeated description thereof will be omitted. In the following description of the embodiments, a description of identical or similar parts will not be repeated in principle unless particularly necessary.

There are cases where hatching may be omitted even in cross-sectional views for clarity of illustration of the embodiments. Alternatively, even plan views may be hatched for clarity of illustration.

Embodiment 1

A semiconductor device according to an embodiment of the present invention will be described with reference to the drawings.

Figure 2:
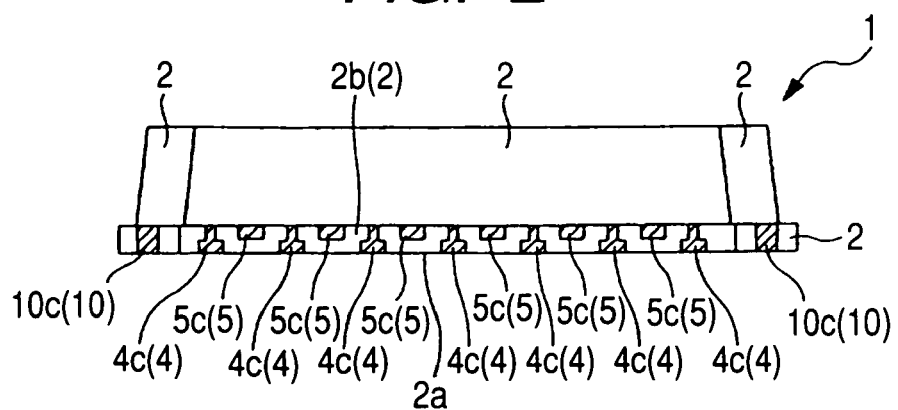
FIG. 2 is a side view of the semiconductor device of FIG. 1.
Figure 3:
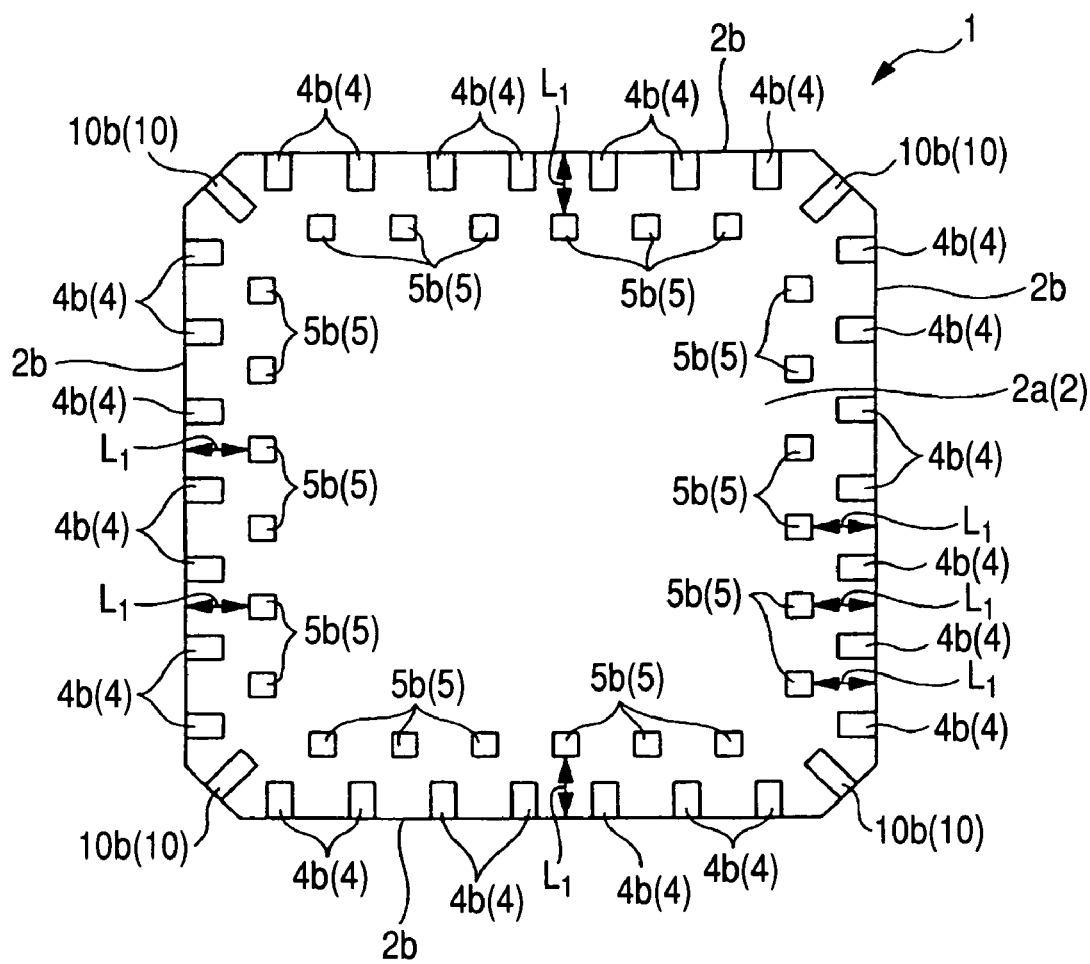
FIG. 3 is a bottom view of the semiconductor device of FIG. 1.
Figure 4:
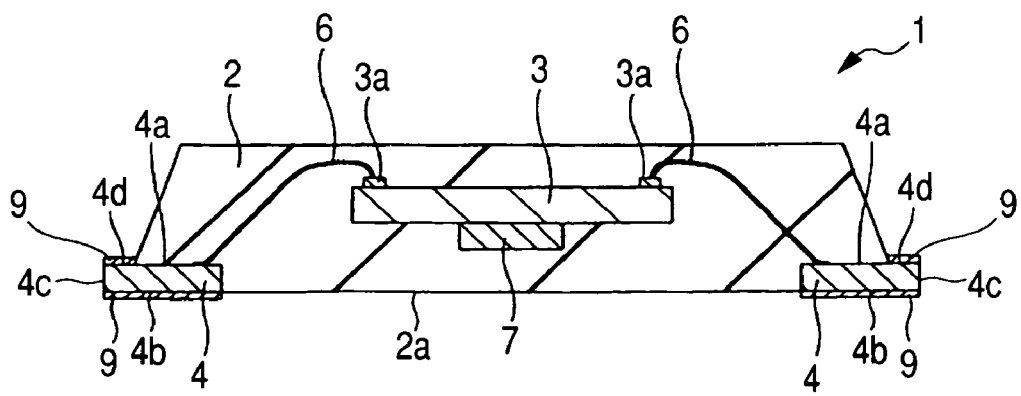
FIG. 4 is a cross-sectional view taken along line A-A in FIG. 1.
Figure 5:
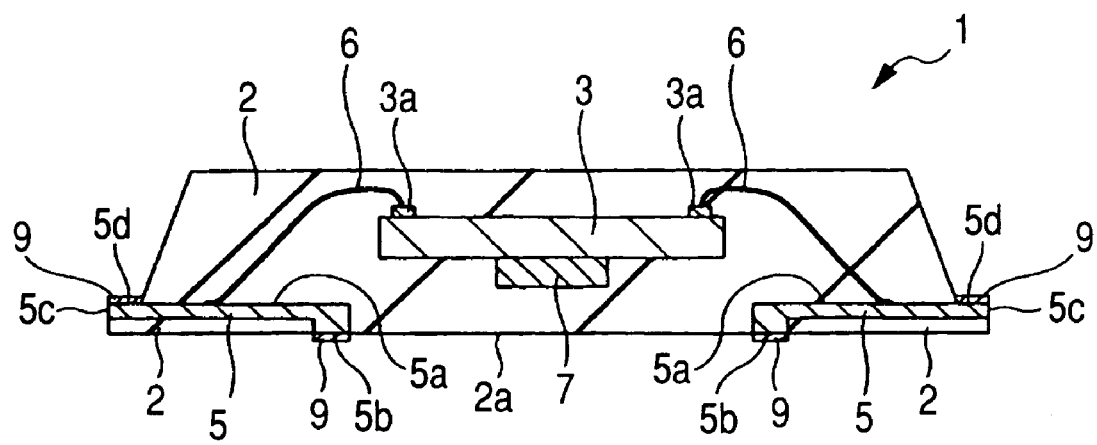
FIG. 5 is a cross-sectional view taken along line B-B in FIG. 1.
Figure 6:
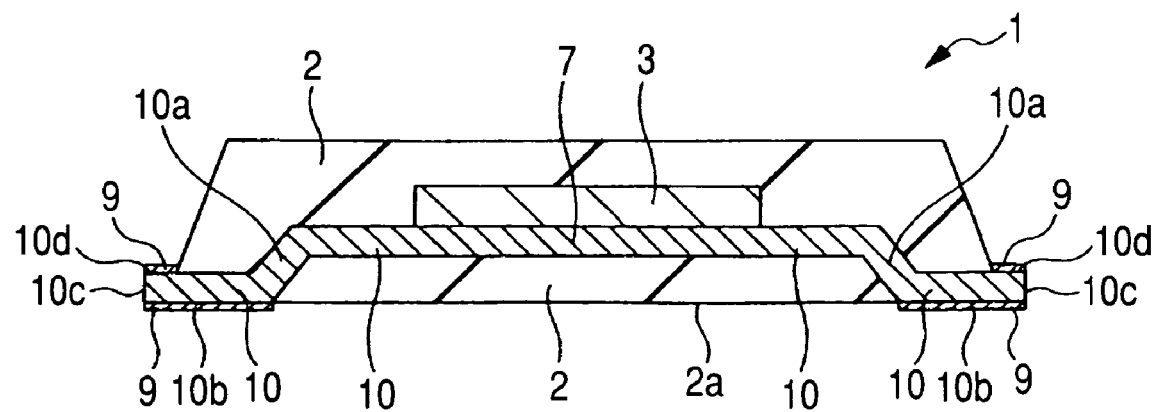
FIG. 6 is a cross-sectional view taken along line C-C in FIG. 1.
Figure 7:
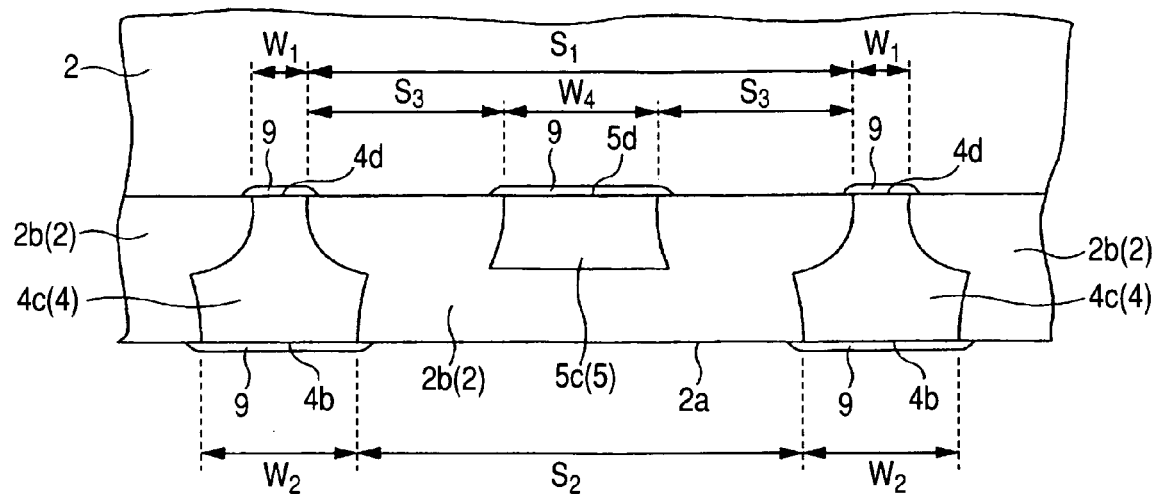
FIG. 7 is an enlarged side view of a portion of the semiconductor device of FIG. 1.
Figure 8:
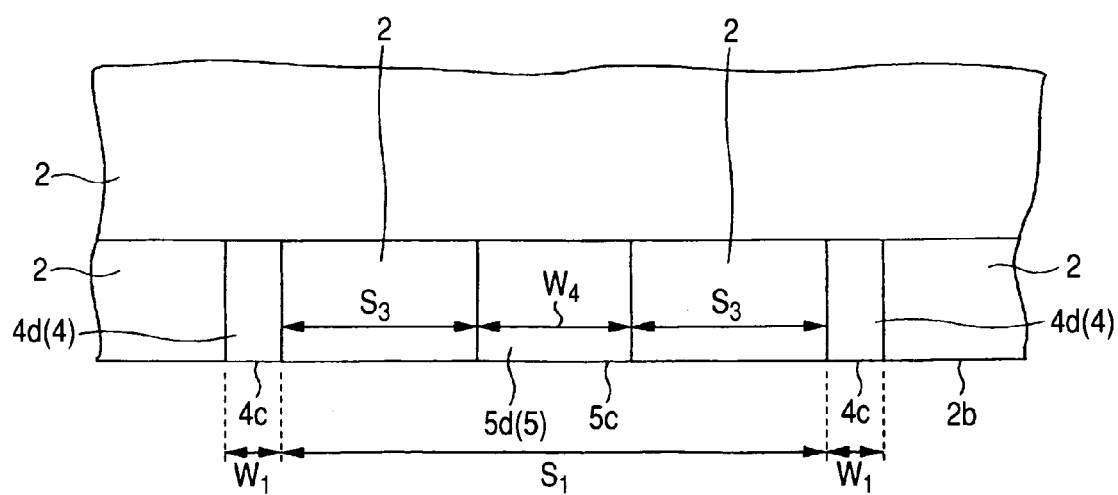
FIG. 8 is an enlarged top view of a portion of the semiconductor device of FIG. 1.
Figure 9:
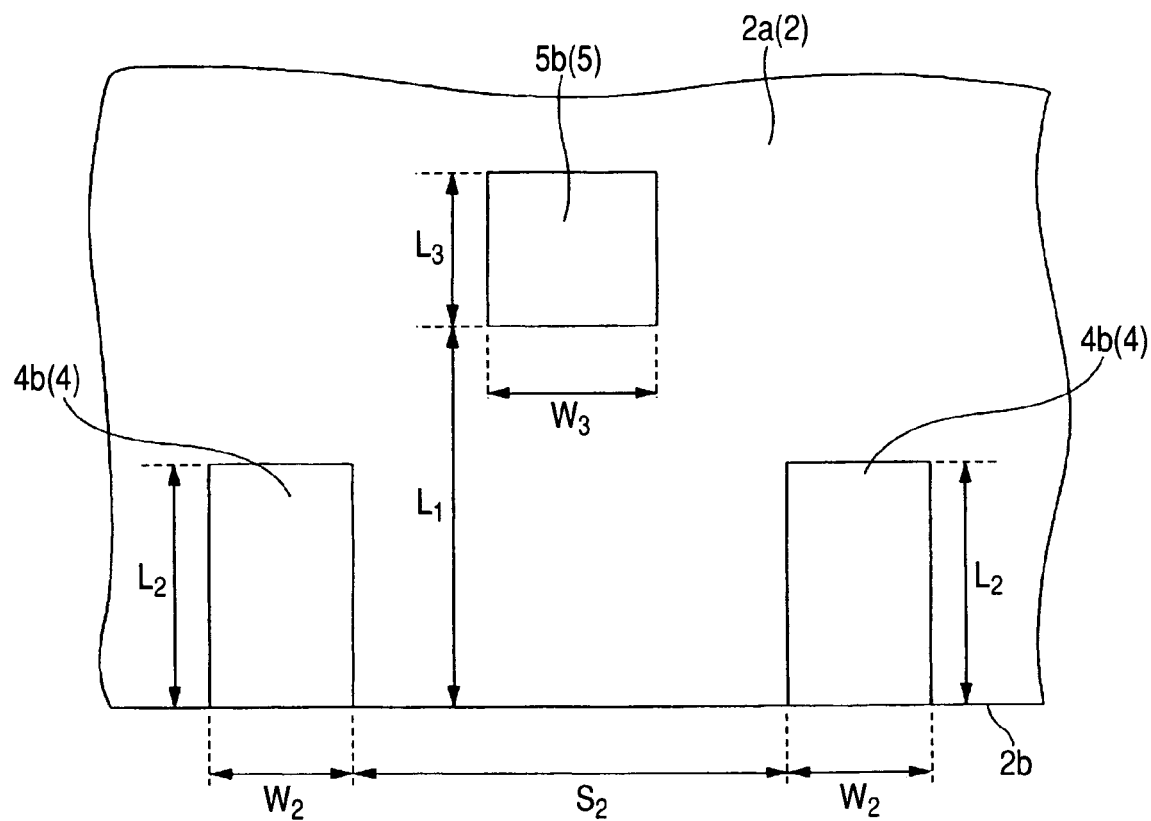
FIG. 9 is an enlarged bottom view of the semiconductor device of FIG. 1.

FIG. 1 is a top view of the semiconductor device according to the present embodiment. FIG. 2 is a side view of the semiconductor device of FIG. 1. FIG. 3 is a bottom view (back face view) thereof. FIGS. 4 to 6 are cross-sectional views (side cross-sectional views) thereof. FIG. 7 is an enlarged side view thereof. FIG. 8 is an enlarged top view of the vicinity of the peripheral portion thereof. FIG. 9 is an enlarged bottom view (back face view) of the vicinity of the peripheral portion thereof. A cross section taken along the line A-A of FIG. 1 substantially corresponds to FIG. 4. A cross section taken along the line B-B of FIG. 1 substantially corresponds to FIG. 5. A cross section taken along the line C-C of FIG. 1 substantially corresponds to FIG. 6. Although FIGS. 1 and 2 are plan views, conductor portions are hatched for clarity of illustration.

A semiconductor device 1 according to the present embodiment includes a semiconductor package of the resin-encapsulated and surface-mount type, which is, e.g., a semiconductor device having a QFN (Quad Flat Non-leaded) package configuration.

The semiconductor device 1 according to the present embodiment, as shown in each of FIGS. 1 to 9, comprises: an encapsulating resin portion (encapsulating portion) 2; a semiconductor chip (semiconductor element) 3 encapsulated in the encapsulating resin portion 2; a plurality of leads (lead portions) 4 and a plurality of leads (lead portions) 5 each formed as a conductor; a plurality of bonding wires 6 encapsulated in the encapsulating resin portion 2 and electrically connecting the plurality of leads 4 and 5 to a plurality of electrodes (bonding pads) 3a on the surface of the semiconductor chip 3; and a tab (die pad portion or chip mounting portion) 7, serving as a chip mounting portion on which the semiconductor chip 3 is mounted.

The encapsulating resin 2 is composed of a resin material, such as a thermosetting resin material, and it may contain a filler or the like. The encapsulating resin 2 can be formed by using, e.g., an epoxy rein containing a filler. The semiconductor chip 3, the leads 4 and 5, the bonding wires 6, and the tab 7 are encapsulated by the encapsulating resin 2 and protected thereby. The back surface (mounting surface) 2a of the encapsulating resin 2 serves as the mounting surface of the semiconductor device 1.

Each of the semiconductor chips 3 has been obtained by forming various semiconductor elements or semiconductor integrated circuits on a semiconductor substrate (semiconductor wafer) made of, e.g., single-crystal silicon, grinding the back surface of the semiconductor substrate, if necessary, and then dividing the semiconductor substrate into individual semiconductor chips 3 by dicing or the like. The semiconductor chip 3 is mounted on the tab 7 with the top surface thereof (the principal surface thereof on which the semiconductor elements are formed) facing upward, so as to have the back surface thereof (the principal surface opposite to the surface on which the semiconductor elements are formed) adhered to the tab 7, which is made of a conductor material, via a joining material (not shown), such as a silver paste or an insulating paste.

The plurality of electrodes (bonding pads or pad electrodes) 3a are formed on the surface of the semiconductor chip 3. The electrodes 3a are electrically connected to the semiconductor element or semiconductor integrated circuit formed on the semiconductor chip 3. The electrodes 3a on the surface of the semiconductor chip 3 are electrically connected to the individual leads 4 and 5 via the bonding wires 6, which are composed of, e.g., metal fine lines, such as gold (Au) lines.

Figure 10:
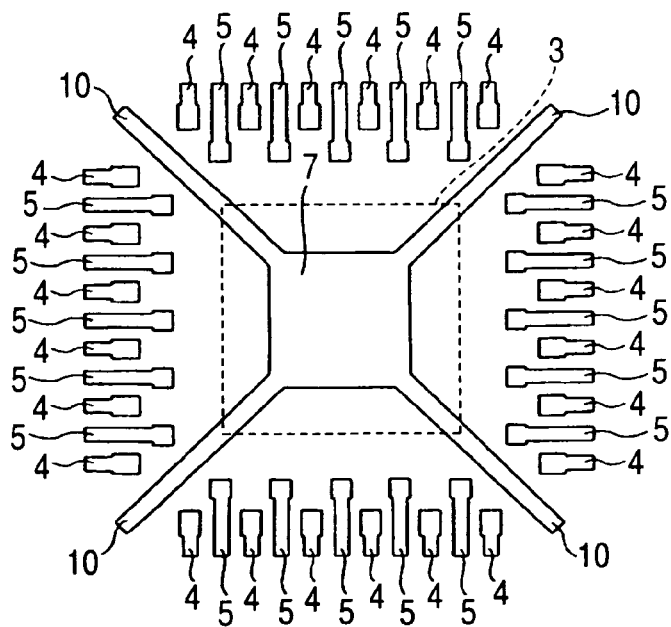
FIG. 10 is a diagram illustrating the leads of a semiconductor device according to an embodiment of the present invention.
Figure 11:
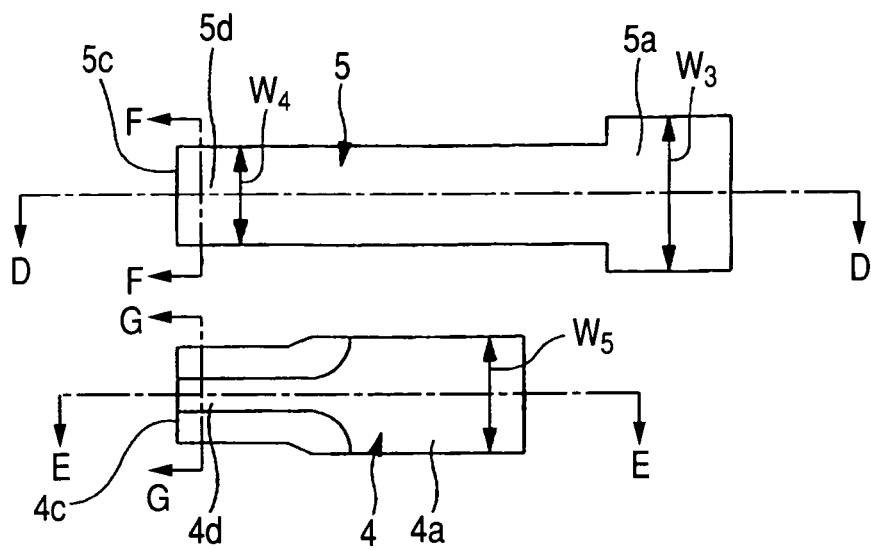
FIG. 11 is a top view of individual leads.
Figure 12:
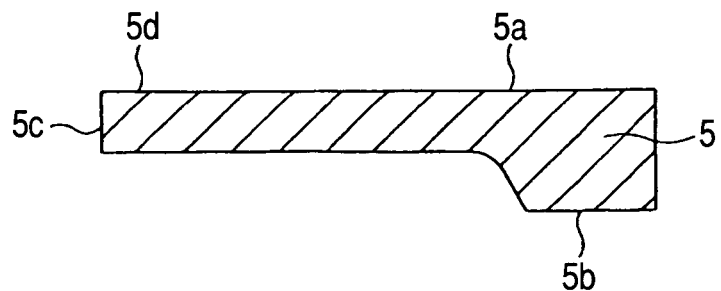
FIG. 12 is a cross-sectional view taken along line D-D in FIG. 11.
Figure 13:
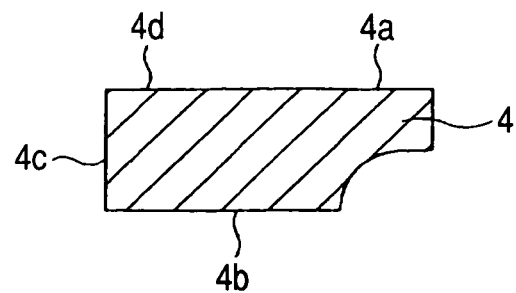
FIG. 13 is a cross-sectional view taken along line E-E in FIG. 11.
Figure 14:
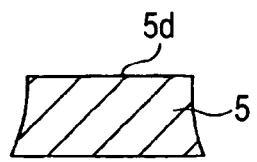
FIG. 14 is a cross-sectional view taken along line F-F in FIG. 11.
Figure 15:
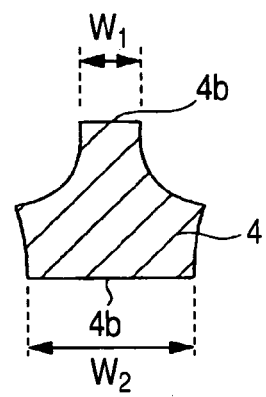
FIG. 15 is a cross-sectional view taken along line G-G in FIG. 11.

FIG. 10 is a view (plan view) illustrating the leads of a semiconductor device according to the present embodiment, which corresponds to FIG. 1 in which an illustration of the encapsulating resin portion 2, the semiconductor chip 3, and the bonding wires 6 is omitted. FIG. 11 is an enlarged view of representative leads in FIG. 10, i.e., a top view (plan view) of the leads 4 and 5. FIGS. 12 and 14 are cross-sectional views of the lead 5. FIGS. 13 and 15 are cross-sectional views of the lead 4. FIG. 12 corresponds to a cross section taken along the line D-D of FIG. 11. FIG. 13 corresponds to a cross section taken along the line E-E of FIG. 11. FIG. 14 corresponds to a cross section taken along the line F-F of FIG. 11. FIG. 15 corresponds to a cross section taken along the line G-G of FIG. 11.

The leads 4 and 5 are alternately arranged around the tab 7 with a respective one of the ends opposing the tab 7.

However, the end portions of the leads 5 opposing the tab 7 extend to positions closer to the tab 7 than the end portions of the leads 4 opposing the tab 7.

Each of the leads 4 and 5 has both the function of an inner lead buried in the encapsulating resin portion 2 and the function of an outer lead exposed at the back surface 2a of the encapsulating resin portion 2. Specifically, the bonding wires 6 are connected (joined) to the respective upper surfaces 4a and 5a of the leads 4 and 5, which are capable of functioning as the bonding portions of the leads 4 and 5, while the lower exposed surfaces 4b and 5b, which constitute the exposed portions of the respective lower surfaces of the leads 4 and 5 and which are capable of functioning as terminal portions for external connection, are exposed at the back surface 2a of the encapsulating resin portion 2. Each of the lower exposed surfaces 4b has a generally rectangular configuration, while each of the lower exposed surfaces 5b has a generally rectangular or generally square configuration.

At the end portions of the leads 4 and 5 opposite to the end portions thereof opposing the tab 7, there are cut surfaces (side surfaces or end surfaces) 4c and 5c which are exposed at the edge (side surfaces) of the encapsulating resin portion 2. The cut surfaces (side surfaces or end surfaces) 4c and 5c of the leads 4 and 5 and the side surfaces 2b of the encapsulating resin portion 2 are surfaces (end surfaces) resulting from a cutting step employed in the manufacture of the semiconductor device.

The portions of the upper surfaces 4a and 5a of the leads 4 and 5, which are proximate to the cut surfaces 4c and 5c, i.e., the upper exposed surfaces 4d and 5d, are exposed from the encapsulating resin portion 2. The spaces between the adjacent leads 4 and 5 are filled with the material composing the encapsulating resin portion 2. Consequently, the upper surfaces 4d and 5d of the leads 4 and 5 are exposed at the thinner region of the encapsulating resin portion 2 which is proximate to the peripheral portion thereof. The upper exposed surface 4d, cut surface 4c, and lower exposed surface 4b of each of the leads 4 are continued relative to each other. Although the upper exposed surfaces 5d and cut surface 5c of each of the leads 5 are continued relative to each other, they are not continued relative to the lower exposed surface 5b of the lead 5. Although a plate layer 9 is formed over the respective portions (i.e., the lower exposed surfaces 4b and 5b and the upper exposed surfaces 4d and 5d) of the leads 4 and 5 which are exposed from the encapsulating resin portion 2, except for the cut surfaces 4c and 5c, the depiction of the plate layer 9 is omitted in the drawings, other than FIGS. 4 to 7, for the sake of clarity.

The back surface of the semiconductor device 1 corresponding to the back surface 2a of the encapsulating resin portion 2, serves as the mounting surface of the semiconductor device 1, and the lower exposed surfaces 4b and 5b of the individual leads 4 and 5 are exposed at the back surface 2a (i.e., the back or bottom surface of the semiconductor device 1) of the encapsulating resin portion 2 to constitute the external terminals (terminals for external connection) of the semiconductor device 1. The formation of the plate layer 9 over the lower exposed surfaces 4b and 5b of the leads 4 and 5 improves the reliability with which electrical connection is provided between terminals, or a conductor pattern on a substrate (an external substrate or a motherboard), and the terminals (the lower exposed surfaces 4b and 5b of the leads 4 and 5) of the semiconductor device 1 when the semiconductor device 1 is mounted on the substrate.

The lower exposed surfaces 4b of the lead portions 4 are arranged at the peripheral region (outer peripheral portion) of the back surface 2a (the back surface of the semiconductor device 1) of the encapsulating resin portion 2. In the present embodiment, the lower exposed surfaces 4b are disposed at positions in contact with the side edges of the back surface 2a of the encapsulating resin portion 2. The lower exposed surfaces 5b of the lead portions 5 are disposed at positions inward of (inner than) the lower exposed surfaces 4b of the back surface 2a of the encapsulating resin portion 2. In the present embodiment, the lower exposed surfaces 5b are disposed at positions spaced at a distance $L_1$ ($L_1 > 0$) from the side edges of the back surface 2a of the encapsulating resin portion 2. The leads 4 and the lead portions 5 are alternately placed (arranged) around the tab 7 (the semiconductor chip 3) and the lower exposed surfaces 4b and 5b, functioning as the external terminals of the semiconductor device 1, are arranged in two rows in a staggered configuration (staggered arrangement) along the side edges of the region of the back surface 2a of the encapsulating resin portion 2, which is proximate to the peripheral portion thereof. Such an arrangement can implement the semiconductor device 1 equipped with multiple terminals.

The suspended leads (conductor portions) 10 are connected to the four corners of each of the tabs 7. Each of the suspended leads 10 is composed of a conductor material and is arranged to have one end connected to the tab 7 so as to extend outwardly of the tab 7. The suspended leads 10 are provided to support the tab 7 on the lead frame and are cut from the lead frame after the formation of the encapsulating resin portion 2. Cut surfaces (side surfaces or end surfaces) 10c, which constitute side surfaces (i.e., the end portions of the suspended leads 10 opposite to the end portions thereof connected to the tab 7) resulting from the cutting of the suspended leads 10, are exposed at the cut surfaces (side surfaces) 2b of the encapsulating resin portion 2. The lower surfaces of the suspended leads 10 are partly exposed at the back surface 2a of the encapsulating resin portion 2. In the present embodiment, lower exposed surfaces 10b, which are the lower surfaces of the regions of the suspended leads 10 located in proximity to the cut surfaces 10c thereof, are exposed at the back surface 2a of the encapsulating resin portion 2. The suspended leads 10 are provided with bent portions 10a so that the portions of the suspended leads 10 which are located inwardly of the lower exposed surfaces 10b and closer to the tab 7 are elevated upward and encapsulated together with the tab 7 in the encapsulating resin portion 2. Each of the leads 4 and 5, the tab 7, and the suspended leads 10 is made of a conductor material, e.g., a common conductor material of the type used for the lead frame in the manufacture of a semiconductor device.

In the present embodiment, the width $W_1$ (substantially corresponding to the width between the upper edges of the cut surfaces 4c of each of the lead portions 4) of the upper exposed surface 4d of each of the leads 4 in the vicinity of the cut surface 4c thereof is smaller than the width $W_2$ (substantially corresponding to the width between the lower edges of the cut surfaces 4c of the lead portion 4) of the lower exposed surface 4b of the lead 4 in the vicinity of the cut surface 4c thereof ($W_1 < W_2$), as can also be seen from FIGS. 7 to 9 and the like. Accordingly, the spacings SI between the upper exposed surfaces 4d of the leads 4 become larger than the spacings $S_2$ between the lower exposed surfaces 4b of the leads 4 ($S_1 > S_2$). The upper exposed surfaces 5d of the leads 5 are placed between the adjacent upper exposed surfaces 4d of the leads 4. In the present embodiment, the width $W_1$ of the upper exposed surface 4d of each of the leads 4 and the width $W_2$ of the lower exposed surface 4b thereof correspond to the width (distance or length) of each of the leads 4 in a direction perpendicular to the direction in which the lead 4 extends and also to the width (distance or length) of the encapsulating resin portion 2 in a direction along (parallel to) the cut surface (side surface) 2b thereof.

By thus adjusting the width $W_1$ of the upper exposed surface 4d of each of the leads 4 in the vicinity of the cut surface 4c thereof to be smaller (than the width $W_2$ of the lower exposed surface 4b), it is possible in the present embodiment to relatively increase the spacing $S_3$ between the adjacent upper exposed surfaces 4d and 5d of the leads 4 and 5. Compared with the case where, e.g., the width $W_1$ of the upper exposed surface 4d of the lead 4 is adjusted to be equal to the width $W_2$ of the lower exposed surface 4b thereof, the spacing $S_3$ between the adjacent upper exposed surfaces 4d and 5d of the leads 4 and 5 can be increased.

If the spacing $S_3$ between the adjacent upper exposed surfaces 4d and 5d of the leads 4 and 5 is small, there is the possibility that, when the individual semiconductor devices 1 are separated from each other by cutting the lead frame for manufacturing the semiconductor devices 1 after forming the encapsulating resin portion 2 by performing a resin molding step with respect to the lead frame, the plate layer 9 formed over the upper exposed surfaces 4d and 5d of the leads 4 and 5 may be crushed, the adjacent upper exposed surfaces 4d and 5d of the leads 4 and 5 may be electrically connected to each other via the crushed plate layer, and a short circuit may occur, as will be described later.

In the present embodiment, since the width $W_1$ of the upper exposed surface 4d of each of the leads 4 has been set to be smaller than the width $W_2$ of the lower exposed surface 4b thereof, the spacing $S_3$ between the adjacent upper exposed surfaces 4d and 5d of the leads 4 and 5 can be relatively increased. Therefore, even when the plate layer 9 that is formed over the upper exposed surfaces 4d and 5d of the leads 4 and 5 is crushed when the individual semiconductor devices 1 are separated from each other by cutting the lead frame after forming the encapsulating resin portion 2, by performing the resin encapsulation step with respect to the lead frame, it is possible to suppress or prevent the phenomenon in which the adjacent upper exposed surfaces 4d and 5d of the leads 4 and 5 are electrically connected to each other via the crushed plate layer. This can prevent the occurrence of a short circuit between the adjacent leads 4 and 5 and to improve the reliability of the semiconductor device 1.

In the present embodiment, the area of the lower exposed surface 4b of each of the leads 4 is larger than the area of the lower exposed surface 5b of each of the leads 5, as can also be seen from FIGS. 3 and 9 and the like. When the semiconductor device 1 is mounted on a substrate (an external substrate or a motherboard, which is not shown herein), a connection is provided between terminals or a conductor pattern on the substrate and the lower exposed surfaces 4b and 5b serving as he external terminals of the semiconductor device 1 via a joining material, such as a solder. However, the connection between the external terminals of the semiconductor device 1 and the terminals or conductor pattern on the substrate may come off if the semiconductor device 1 or the substrate undergoes warping due to temperature variations in an ambient environment or the like. This degrades the reliability with which the semiconductor device 1 is mounted on the substrate. When the semiconductor device 1 becomes warped, there is a tendency that the connection of the terminals disposed at the more peripheral portion (outer peripheral portion) of the back surface of the semiconductor device 1 is more likely to come off. To improve the reliability with which the semiconductor device 1 is mounted on the substrate, therefore, it becomes more important to improve the reliability with which, of the lower exposed surfaces 4b and 5b functioning as external terminals of the semiconductor device 1, the lower exposed surfaces 4b disposed at the more peripheral portion of the back surface 2a (the back surface of the semiconductor device 1) of the encapsulating resin portion 2 are connected to the terminals or conductor pattern on the substrate. Since the present embodiment has adjusted the area of the lower exposed surface 4b of each of the leads 4, serving as the external terminals that are placed at the more peripheral portion of the back surface 2a of the encapsulating resin portion 2, to be larger than the area of the lower exposed surface 5b of each of the leads 5, the reliability with which connection is provided between the terminals or conductor pattern on the substrate and the lower exposed surfaces 4b of the semiconductor device 1 can be improved when the semiconductor device 1 is mounted on the substrate. Accordingly, even if the semiconductor device 1 mounted on the substrate undergoes warping, it becomes possible to maintain, in an excellent state, the connection of the lower exposed surfaces 4b serving as terminals at the more peripheral portion of the back surface of the semiconductor device 1, where the connection is more likely to come off, to the substrate and, thereby, to improve the reliability of the semiconductor device 1 (the reliability with which the semiconductor device 1 is mounted on the substrate).

In the present embodiment, the length $L_2$ of the lower exposed surface 4b of each of the leads 4 is preferably larger than the length $L_3$ of the lower exposed surface 5b of each of the leads 5 ($L_2>L_3$), while the width $W_2$ of the lower exposed surface 4b of the lead 4 is preferably smaller than the width $W_3$ of the lower exposed surface 5b of the lead 5 ($W_2<W_3$). In the present embodiment, the length $L_2$ of the lower exposed surface 4b of the lead 4 and the length $L_3$ of the lower exposed surface 5b of the lead 5 correspond to the respective lengths (distances) of the leads 4 and 5 in directions (parallel to) in which the leads 4 and 5 extend and also to the length (distance) of the encapsulating resin portion 2 in a direction perpendicular to the cut surfaces (side surfaces) 2b thereof. The width $W_3$ of the lower exposed surface 5b of each of the leads 5 corresponds to the width (distance or length) of the lead 5 in a direction perpendicular to the direction in which the lead 5 extends and also to the width (distance or length) of the encapsulating resin portion 2 in a direction along (parallel to) the cut surfaces (side surfaces) 2b thereof.

The pitch (the sum of the width $W_2$ of each of the lower exposed surfaces 4b and the spacing $S_2$ between the lower exposed surfaces 4b, i.e., $W_2+S_2$) of the lower exposed surfaces 4b of the leads 4 is defined to have a constant value by the specifications and can be adjusted to, e.g., about 0.65 mm. If the width $W_2$ of the lower exposed surface 4b of the lead 4 is excessively increased, the spacings between the leads 4 are reduced so that the phenomenon is more likely in which a short circuit occurs between the lead 5 and the adjacent leads 4 between which the lead 5 is interposed via the plate layer, which is crushed between the upper exposed surfaces 4d and 5d of the leads 4 and 5 when the lead frame is cut. The present embodiment has relatively increased the area of the lower exposed surface 4b of each of the leads 4 by adjusting the width $W_2$ of the lower exposed surface 4b of the lead 4 to a smaller value (a value smaller than the width $W_3$ of the lower exposed surface 5b of each of the leads 5) of, e.g., about 0.16 mm ($W_2$=0.16 mm) and by adjusting the length $L_2$ of the lower exposed surface 4b of the lead 4 to a larger value (a value larger than the length $L_3$ of the lower exposed surface 5b) of, e.g., 0.35 mm ($L_2$=0.35 mm). The reliability with which the semiconductor device 1 is mounted on the substrate can be improved by reducing the width $W_2$ of the lower exposed surface 4b of the lead 4 to prevent a short circuit between the leads 4 and 5 and by increasing the length $L_2$ of the lower exposed surface 4b to increase the area of the lower exposed surface 4b.

In the present embodiment, the width of the portion of the lead 5 which is proximate to the end portion thereof opposing the tab 7 is preferably larger than the width of the portion of the lead 5 which is proximate to the cut surface 5c thereof, as can also be seen from FIG. 11 and the like. For example, the width $W_3$ of the lower exposed surface 5b of the lead 5 is preferably larger than the width $W_4$ of the upper exposed surface 5d of the lead 5 ($W_3$>$W_4$). By thus reducing the width of the portion of the lead 5 which is proximate to the cut surface 5c (the width $W_4$ of the upper exposed surface 5d) and thereby relatively increasing the spacing $S_3$ between the upper exposed surface 4d of the lead 4 and the upper exposed surface 5d of the lead 5, the phenomenon in which a short circuit occurs via the plate layer that is crushed between the upper exposed surfaces 4d and 5d of the leads 4 and 5 when the lead frame is cut can be suppressed, while the reliability with which the semiconductor device is mounted on the substrate can be improved by increasing the width $W_3$ of the lower exposed surface 5b of the lead 5, thereby increasing the area of the lower exposed surface 5b. By relatively increasing the width of the portion of the lead 5 which is proximate to the end portion thereof opposing the tab 7, it becomes possible to enhance the adhesion between the encapsulating resin portion 2 and the leads 5 and to further improve the reliability of the semiconductor device.

In the present embodiment, the width $W_5$ of the portion of the upper surface 4a of the lead 4 which is proximate to the end portion thereof opposing the tab 7 is preferably larger than the width $W_2$ of the lower exposed surface 4b of the lead ($W_5$>$W_2$). This can enhance the adhesion between the encapsulating resin portion 2 and the leads 4 when the leads 4 are encapsulated in the encapsulating resin portion 2 and further improve the reliability of the semiconductor device.

Figure 16:
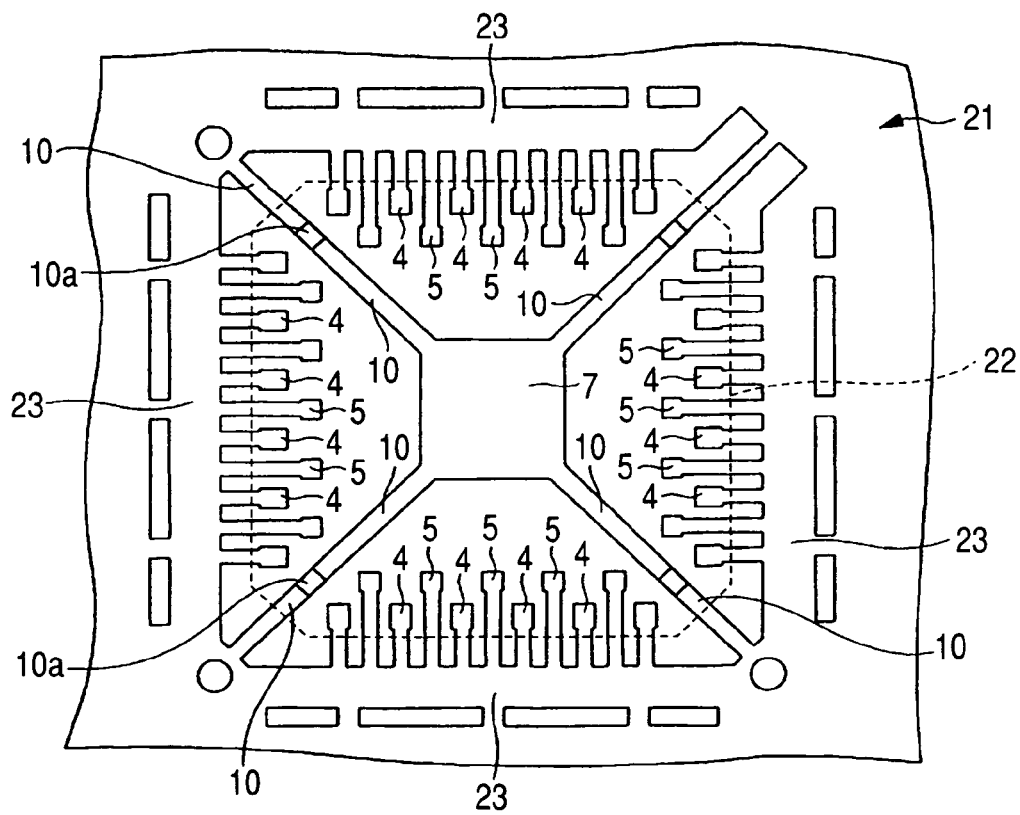
FIG. 16 is a plan view of the principal portion of a lead frame.

A description will be given next concerning the steps of manufacturing the semiconductor device according to the present embodiment. FIG. 16 is a plan view of a principal portion of a lead frame 21 used to manufacture the semiconductor device according to the present embodiment. FIGS. 17 to 20 and FIG. 22 are cross-sectional views illustrating the individual steps of manufacturing the semiconductor device according to the present embodiment, in which cross sections corresponding to FIG. 4 are shown. FIG. 21 is a view illustrating a plating step. FIG. 16 shows the region of the lead frame 21 corresponding to one semiconductor package, in which a mold line 22 is designated by the dotted line.

The lead frame 21 is made of a conductor material, such as, e.g., copper, a copper alloy, or 42 Alloy. The lead frame 21 has: the tab 7 for mounting thereon the semiconductor chip 3; the suspended leads 10 having one of the ends thereof connected to a frame body 23 and the other ends connected to the four corners of the tab 7 to support the tab 7; and the lead portions 4 and 5 arranged to have one of the end thereof in spaced apart and opposing relation to the tab 7 and the other end connected to the frame body 23.

The leads 4 and 5 are alternately arranged such that the end portions of the leads 5 opposing the tab 7 extend to positions closer to the tab 7 than the end portions of the leads 4 opposing the tab 7. Consequently, the end portions of the leads 4 opposing the tab 7 and the end portions of the leads 5 opposing the tab 7 are arranged in a staggered configuration.

As can also be seen from FIGS. 11, 12, and 14 and the like, each of the leads 5 has been formed to have a thickness which is larger in the region thereof (the region corresponding to the lower exposed surface 5b) proximate to the end portion thereof opposing the tab 7 and smaller in the other region thereof by performing half etching or the like with respect to the lower surface of the lead 5. When the encapsulating resin portion 2 is formed, therefore, the lower exposed surfaces 5b of the leads 5 are exposed at the back surface 2a of the encapsulating resin portion 2, while the regions of the leads 5 other than the thicker lower exposed surfaces 5b are encapsulated in the encapsulating resin portion 2.

As can also be seen from FIGS. 11, 13, and 15 and the like, the lower surfaces (bottom surfaces) of the leads 4 are substantially flat and even except for the regions of the leads 4 which are proximate to the end portions thereof opposing the tab 7. When the encapsulating resin portion 2 is formed, therefore, the lower surfaces of the leads 4 are exposed as the lower exposed surfaces 4b at the back surface 2a of the encapsulating resin portion 2. When the encapsulating resin portion 2 is formed, the lower exposed surfaces 5b of the leads 5 and the lower exposed surfaces 4b of the leads 4 are arranged in two rows in a staggered configuration at the back surface 2a of the encapsulating resin portion 2.

Each of the leads 4 has been processed such that the upper surface of the region thereof serving as the upper exposed surface 4d has a width smaller than the width of the lower surface of the lead 4 (i.e., such that the width $W_1$ of the upper exposed surface 4d is smaller than the width $W_2$ of the lower exposed surface 4b) by performing half etching or the like with respect to the upper surface of the lead 4. For example, the lead 4 has been processed such that the width of the upper surface thereof is smaller than the width of the lower surface thereof in the region proximate to the mold line 22. Such processing can also be performed by using a mold die or the like.

After preparing such a lead frame 21, the semiconductor device can be manufactured in, e.g., the following manner.

Figure 17:
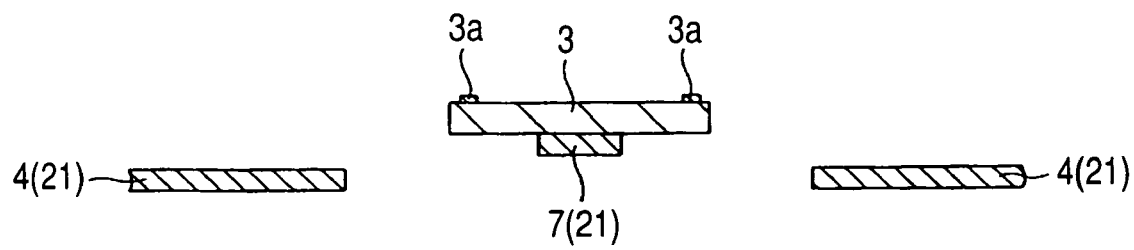
FIG. 17 is a cross-sectional view of the principal portion of the semiconductor device according to the embodiment as seen in a manufacturing step.

First, as shown in FIG. 17, the semiconductor chip 3 is adhered onto each of the tabs 7 of the lead frame 21 via a joining material (not shown) such as a silver paste or an insulating paste.

Figure 18:
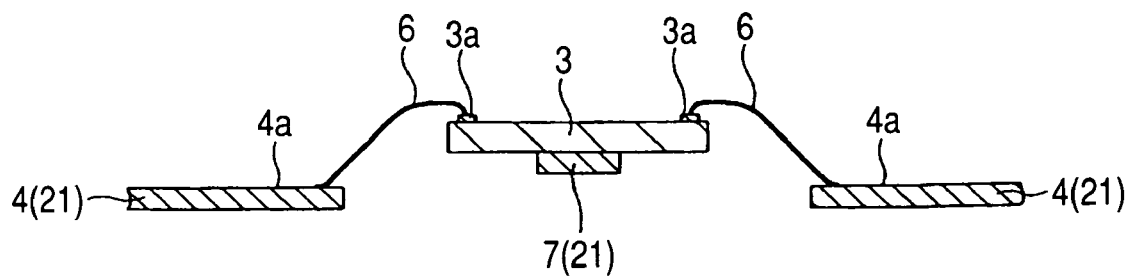
FIG. 18 is a cross-sectional view of the semiconductor device as seen in a manufacturing step subsequent to the step shown in FIG. 17.

Next, as shown in FIG. 18, a wire bonding step is performed to electrically connect the plurality of electrodes 3a of the semiconductor chip 3 to the upper surfaces 4a and 5a of the plurality of leads 4 and 5 of the lead frame 21 via the plurality of bonding wires 6.

Figure 19:
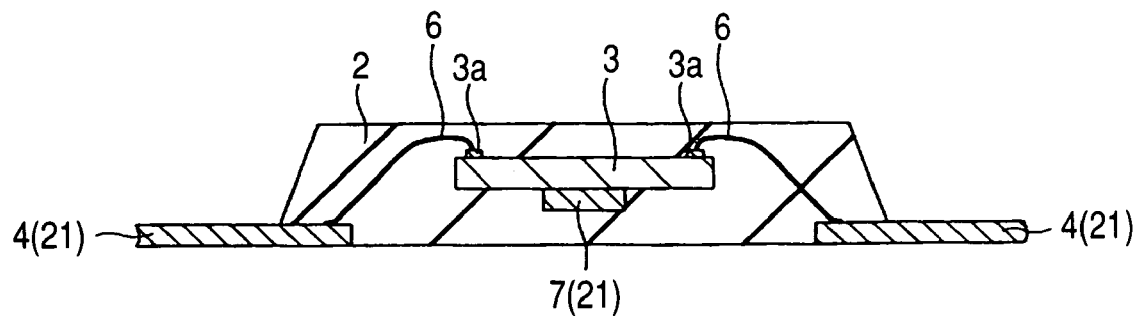
FIG. 19 is a cross-sectional view of the semiconductor device as seen in a manufacturing step subsequent to the step shown in FIG. 18.

Next, as shown in FIG. 19, a molding step (e.g., a transfer molding step) is performed to encapsulate the semiconductor chip 3 and the bonding wires 6 in the encapsulating resin portion 2. At this time, the respective portions of the lead portions 4 and 5, the tab 7, and the suspended leads 10 which are located inside the mold line 22 of the lead frame 21 are also encapsulated in the encapsulating resin portion 2. At this time, the encapsulating resin portion 2 is formed so as to be relatively thick in the region located inside the mold line 22, while the spaces between the leads 4 and 5 and the like are filled with the material composing the encapsulating resin portion 2 in the peripheral region around the mold line 22.

Figure 20:
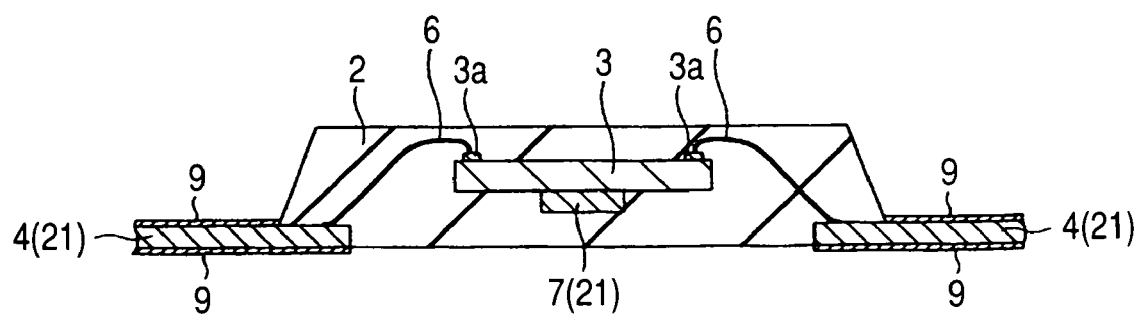
FIG. 20 is a cross-sectional view of the semiconductor device as seen in a manufacturing step subsequent to the step shown in FIG. 19.
Figure 21:
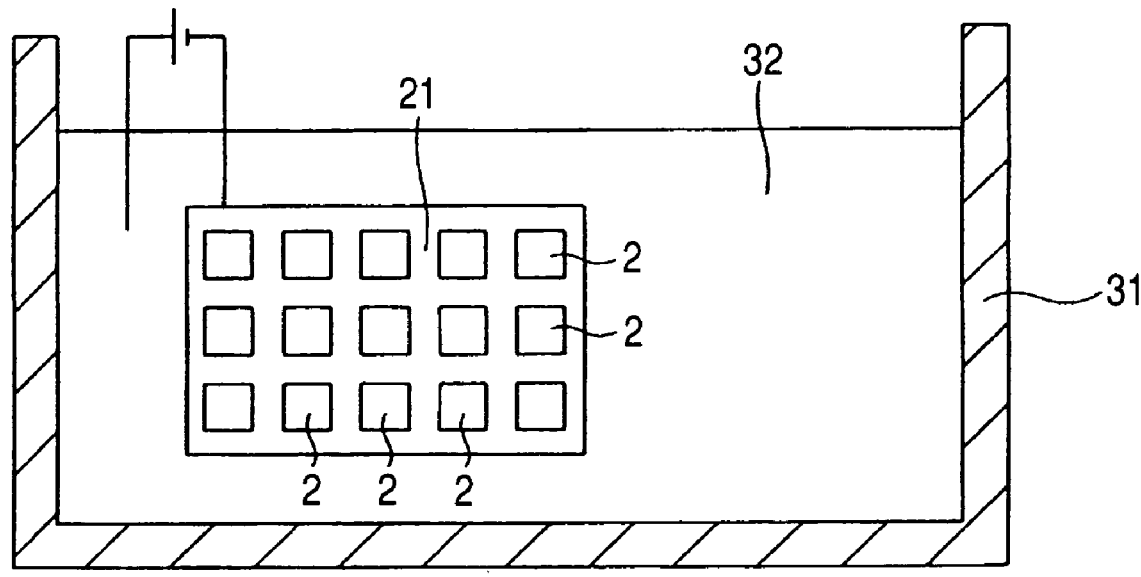
FIG. 21 is a diagram illustrating a plating step.

Next, as shown in FIG. 20, the plate layer 9 is formed over the exposed portions of the lead frame 21. In the plating step, electrolytic plating, e.g., may be used. For example, the lead frame 21 formed with the encapsulating resin portion 2 is immersed in a plating solution 32 reserved in a plating tank 31 and a voltage is applied between the lead frame 21 and the plating solution 32, as shown in FIG. 21, whereby the plate layer 9 is formed over the portions (portions made of a conductor) of the lead frame 21 exposed from the encapsulating resin portion 2.

Figure 22:
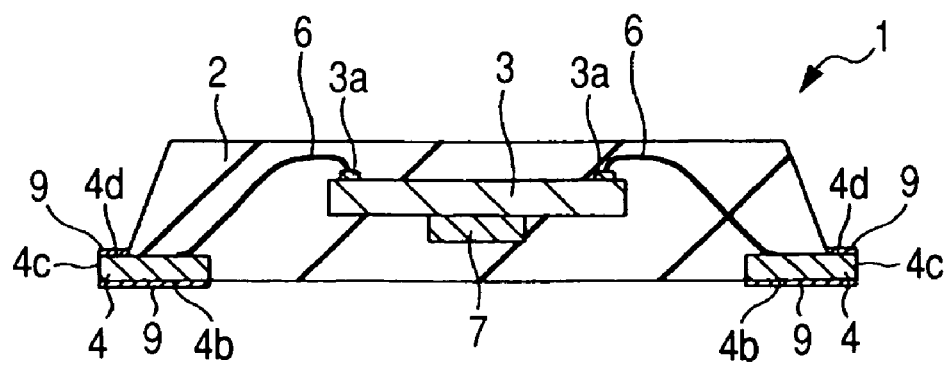
FIG. 22 is a cross-sectional view of the semiconductor device as seen in a manufacturing step subsequent to the step shown in FIG. 20.

Next, as shown in FIG. 22, the lead frame 21 is cut at specified positions so that individually separated semiconductor devices 1 are obtained.

Figure 23:
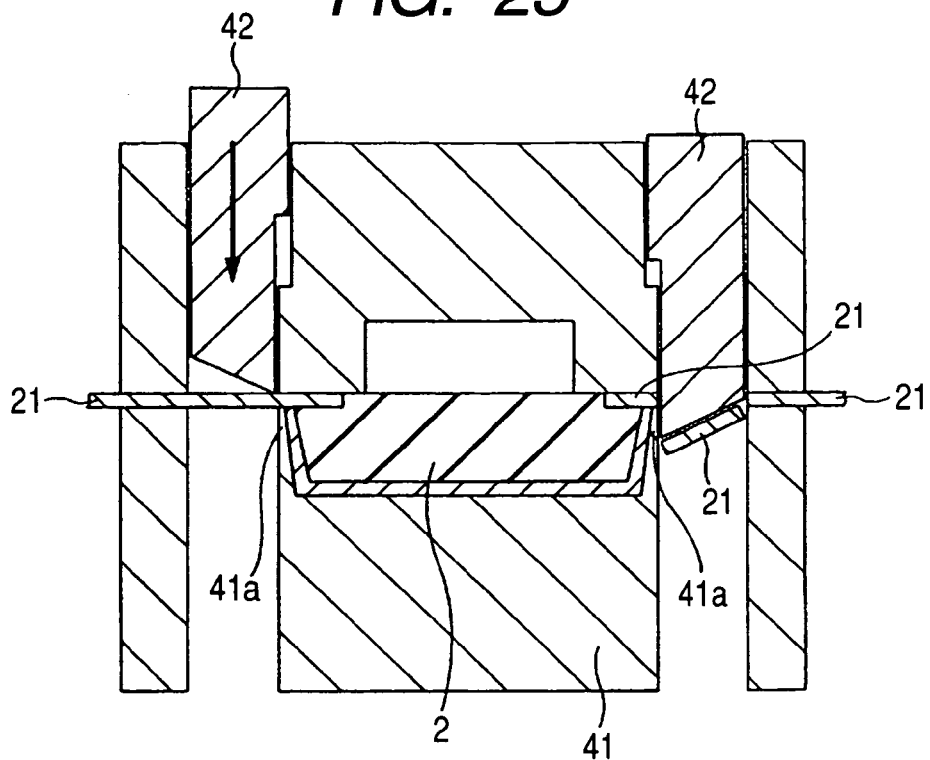
FIG. 23 is a section view illustrating the step of cutting the lead frame.
Figure 24:
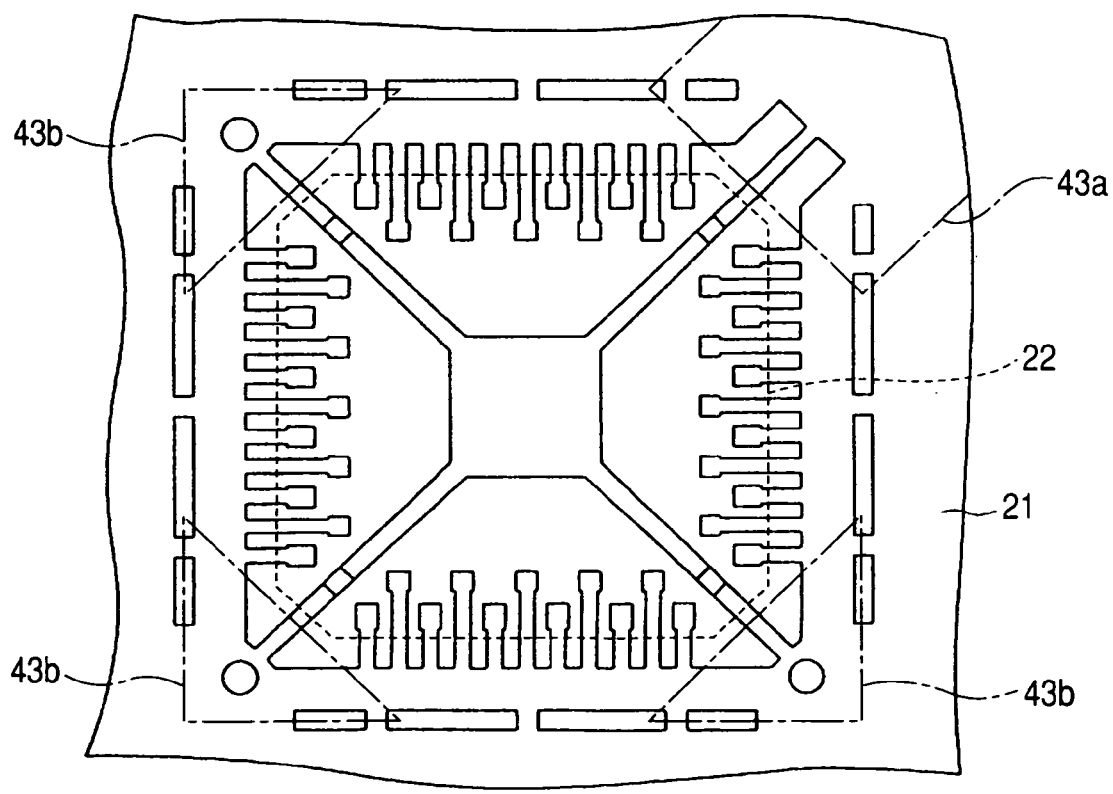
FIG. 24 is a plan view illustrating the punched out region of the lead frame.
Figure 25:
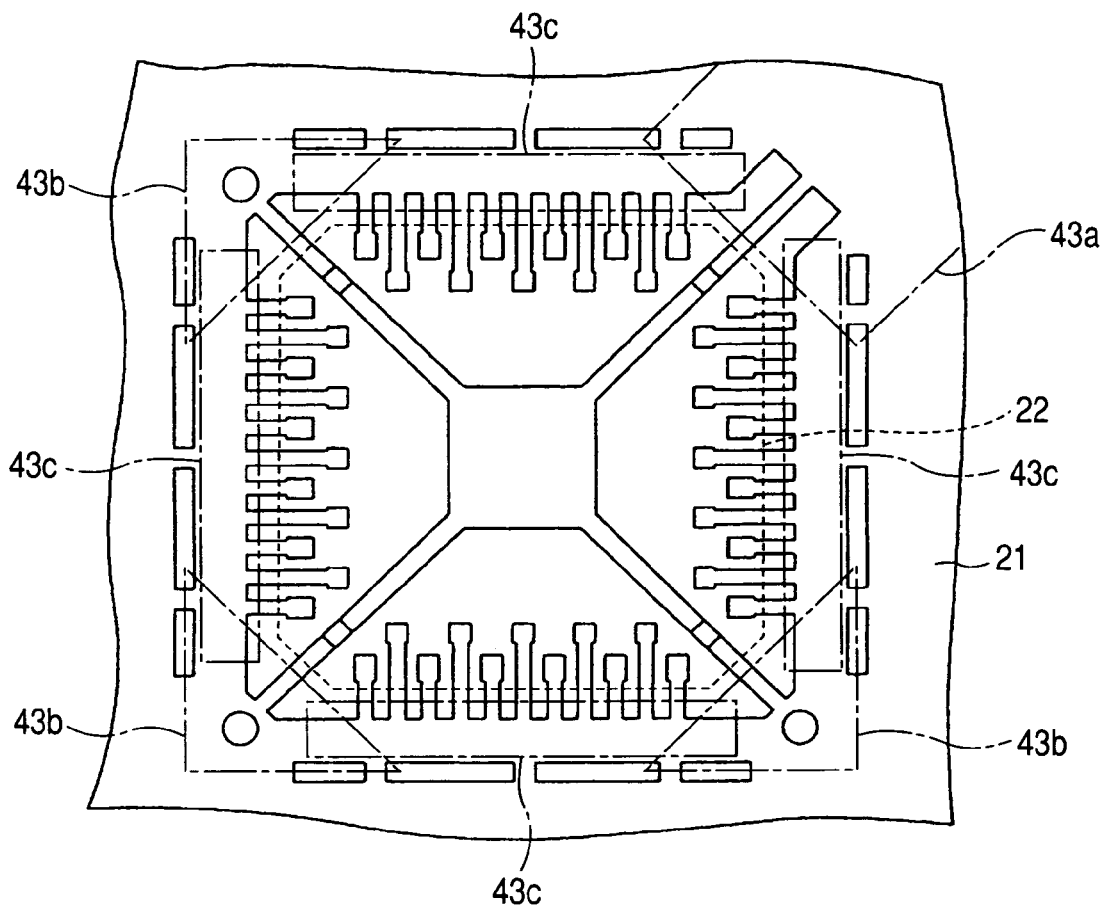
FIG. 25 is a plan view illustrating the punched out region of the lead frame.

FIG. 23 is a cross-sectional view illustrating the step of cutting the lead frame 21. FIGS. 24 and 25 are plan views each illustrating the punched out region of the lead frame 21. FIGS. 24 and 25 show the regions of the lead frame 21 shown in FIG. 16 to be punched out in this cutting step.

After forming the encapsulating resin portion 2 and performing a plating process as described above (see FIGS. 17 to 21), the lead frame 21 is placed on a support table 41 and the specified regions of the lead frame 21 are punched out by using a punch (puncher or cutter) 42, as shown in FIG. 23. At this time, a target region 43a (corresponding to the gate region in the molding step) shown in FIG. 24 is punched out first and then three target regions 43b are punched out. Subsequently, four target regions 43c shown in FIG. 25 are punched out. Upon punching out the lead frame 21, particularly the target regions 43c thereof, the upper exposed surfaces 4d and 5d of the leads 4 and 5 and the vicinities thereof are pressed firmly against the cutting die 41a of the support table 41. The region inside the mold line 22 and the peripheral region around the mold line 22 are thus separated from the lead frame 21 so that individually separated semiconductor devices 1 are obtained, as shown in FIG. 22.

Figure 26:
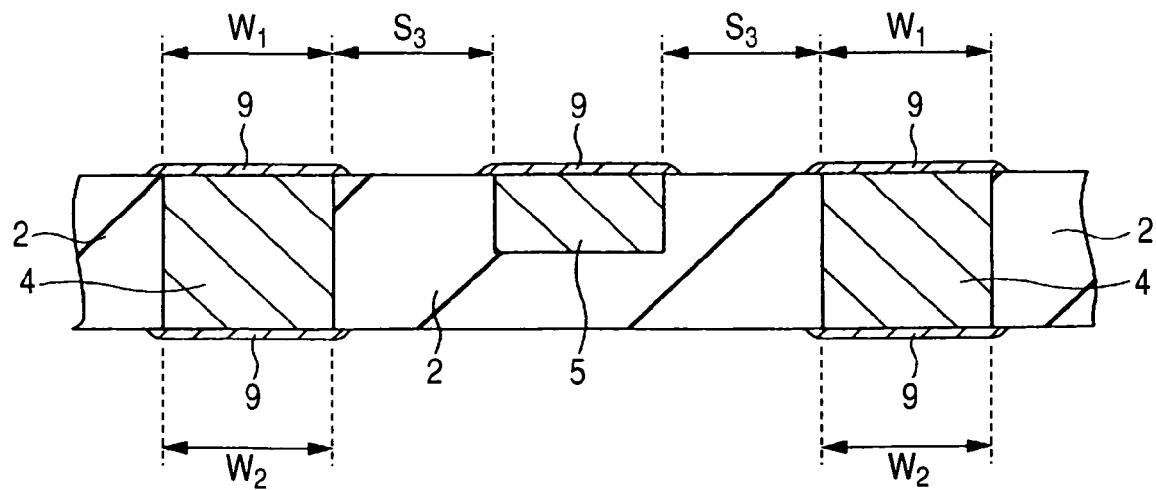
FIG. 26 is a cross-sectional view of the principal portion of the semiconductor device as seen in a manufacturing step when the width of the upper exposed surface of the lead is adjusted to be equal to that of the lower exposed surface thereof.
Figure 27:
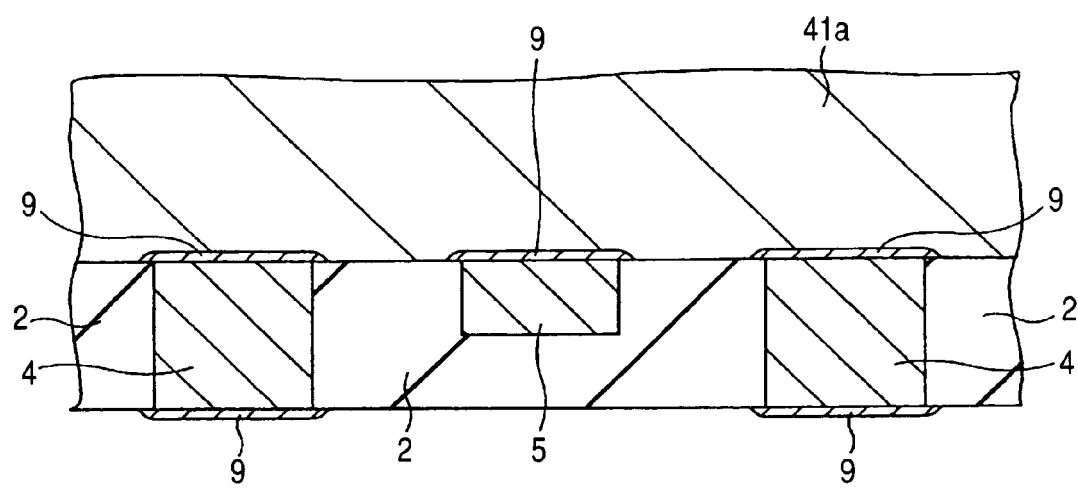
FIG. 27 is a cross-sectional view of the principal portion of the semiconductor device as seen in a manufacturing step when the width of the upper exposed surface of the lead is adjusted to be equal to that of the lower exposed surface thereof.
Figure 28:
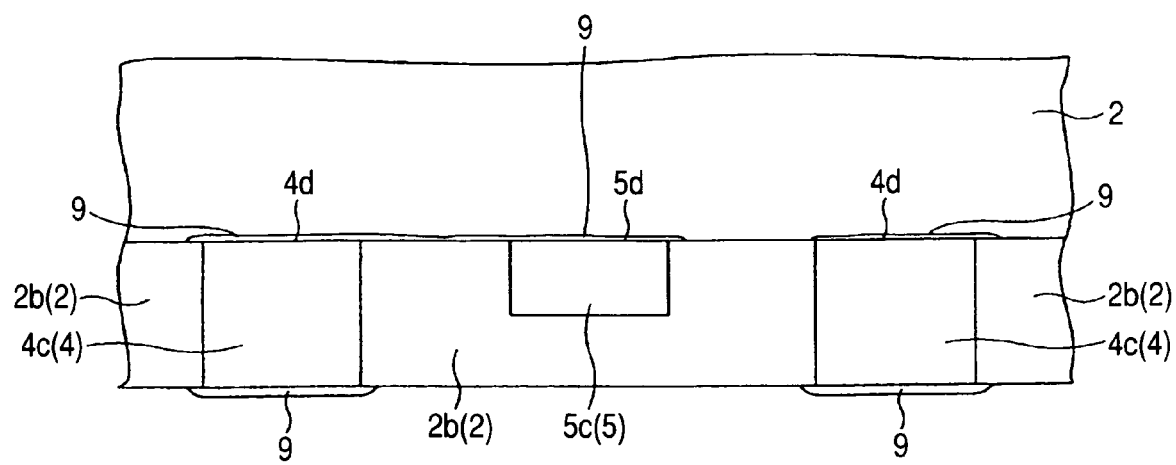
FIG. 28 is a side view of the principal portion of the semiconductor device as seen in a manufacturing step when the width of the upper exposed surface of the lead is adjusted to be equal to that of the lower exposed surface thereof.

FIGS. 26 to 28 are cross-sectional views and side views of a principal portion of a semiconductor device as seen in the manufacturing steps when the width $W_1$ of the upper exposed surface 4d of each of the leads 4 and the width $W_2$ of the lower exposed surface 4b thereof are adjusted to be equal, which is different from the semiconductor device 1 according to the present embodiment. FIG. 26 shows a cross section of the principal portion of the semiconductor device at the stage corresponding to the step of FIG. 20 (after the plating process is performed with respect to the lead frame and before the lead frame is cut). FIG. 27 shows a cross section of the principal portion of the semiconductor device in which the upper exposed surfaces 4d and 5d of the leads 4 and 5 are in contact with the cutting die 41a of the support table 41 at the stage corresponding to the step of FIG. 23 (the step of cutting the lead frame). Each of the cross sections shown in FIGS. 26 and 27 has been taken along a plane along which cutting is to be performed in the step of cutting the lead frame. FIG. 28 shows a side view (partially enlarged side view) of the principal portion of the cut surfaces after the step of cutting the lead frame. Although the step of cutting the lead frame is performed with the back surface 2a of the encapsulating resin portion 2 facing upward, the encapsulating resin portion 2 is shown with the back surface 2a thereof facing downward in FIGS. 26 to 28 for the sake of clarity.

When the width $W_1$ of the upper exposed surface 4d of each of the leads 4 and the width $W_2$ of the lower exposed surface 4b thereof are adjusted to be equal in the vicinity of the cut surfaces 4c as shown in FIG. 26, unlike in the present embodiment, the spacing $S_3$ between the adjacent upper exposed surfaces 4d and 5d of the leads 4 and 5 becomes relatively small.

When the lead frame 21 placed on the support table 41 is punched out by using the punch 42, the lead frame 21 is placed on the support table 41 with the back surface 2a of the encapsulating resin portion 2 facing upward, as shown in FIG. 23, so that the upper exposed surfaces 4d and 5d of the leads 4 and 5 and the vicinities thereof are pressed against the cutting die 41a of the support table 41. Accordingly, a relatively high pressure is applied onto the upper exposed surfaces 4d and 5d of the leads 4 and 5 when the lead frame is punched out by using the punch 42. This causes the possibility that the plate layer 9 formed over the upper exposed surfaces 4d and 5d of the leads 4 and 5 is crushed and extended in a lateral direction of FIG. 27.

The cutting (punching out) of the lead frame 21 may also be performed conceivably by placing the lead frame 21 on the support table 41 with the back surface 2a of the encapsulating resin portion 2 facing downward. In this case, however, the lower exposed surfaces 4b and 5b of the leads 4 and 5 and the vicinities thereof are pressed firmly against the cutting die 41a of the support table 41 so that contamination, a foreign substance, and the like are adhered to the lower exposed surfaces 4b and 5b of the leads 4 and 5 which should function as the external terminals of the semiconductor device. This may cause degradation of the reliability of the semiconductor device (the reliability with which, e.g., the semiconductor device is mounted on the substrate). It is therefore preferable to perform the punching out (cutting) of the lead frame 21 with the back surface 2a of the encapsulating resin portion 2 facing upward.

Thus, the step of cutting the lead frame may result in a situation in which the plate layer 9 formed over the upper exposed surfaces 4d and 5d of the leads 4 and 5 are crushed and extended laterally, as shown in FIG. 28, the adjacent upper exposed surfaces 4d and 5d of the leads 4 and 5 are electrically connected to each other via the crushed and extended solder layer 9, and a short circuit occurs. In addition, a solder film formed by electrolytic plating has the tendency that the thickness thereof increases at the corner portions thereof due to the localization of an electric field to the corner portions. Accordingly, such a phenomenon becomes more prominent when an electrolytic plate layer (plate layer formed by electrolytic plating) is used as the plate layer 9. Such a phenomenon also becomes more prominent when the spacings between the leads 4 and 5 are reduced to implement a miniaturized semiconductor device or a semiconductor device equipped with multiple terminals.

By contrast, the width $W_1$ of the upper exposed surface 4d of each of the leads 4 has been adjusted to be smaller than the width $W_2$ of the lower exposed surface 4b ($W_1 < W_2$) thereof in the vicinity of the cut surfaces 4c in the semiconductor device 1 according to the present embodiment, as can also be seen from FIGS. 7 to 9 and the like. Accordingly, the spacing $S_3$ between the adjacent upper exposed surfaces 4d and 5d of the leads 4 and 5 can be relatively increased. Consequently, even when the plate layer 9 formed over the upper exposed surfaces 4d and 5d of the leads 4 and 5 are crushed and extended when the lead frame 21 is cut, as shown in FIG. 23, the phenomenon can be suppressed or prevented in which the adjacent upper exposed surfaces 4d and 5d of the leads 4 and 5 are electrically connected to each other via the crushed and extended plate layer. This can prevent the occurrence of a short circuit between the adjacent leads 4 and 5 and improve the reliability of the semiconductor device 1. Since the short circuit between the leads 4 and 5 via the crushed plate layer can be prevented even when the spacings between the leads 4 and 5 are reduced, a miniaturized semiconductor device or a semiconductor device equipped with multiple terminals can be implemented. This also allows the use of an electrolytic plate layer as the plate layer 9 and thereby achieves a reduction in the manufacturing cost for the semiconductor device.

The processing of the lead frame 21 for adjusting the width $W_1$ of the upper exposed surfaces 4d of each of the leads 4 to be smaller than the width $W_2$ of the lower exposed surface 4b thereof can be performed by various techniques. For example, the adjustment can be made by performing half etching or the like with respect to the upper surfaces of the leads 4 when the lead frame 21 is formed by etching or the like. It is also possible to perform the processing for adjusting the width $W_1$ of the upper exposed surface 4d (the region corresponding thereto) of the lead 4 of the lead frame 21 to be smaller than the width $W_2$ of the lower exposed surface 4b (the region corresponding thereto) of the lead 4 by using a mold die or the like.

Embodiment 2

Figure 29:
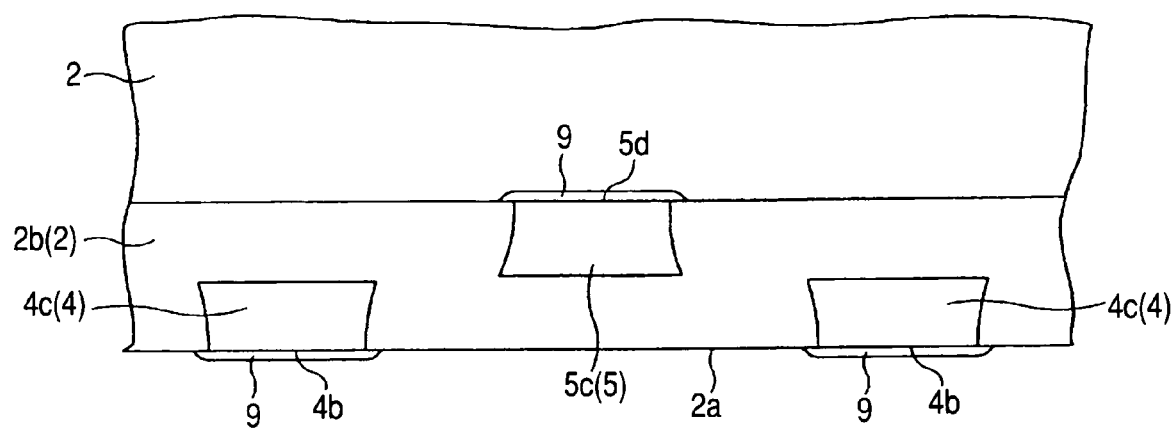
FIG. 29 is an enlarged side view of a portion of a semiconductor device according to another embodiment of the present invention.
Figure 30:
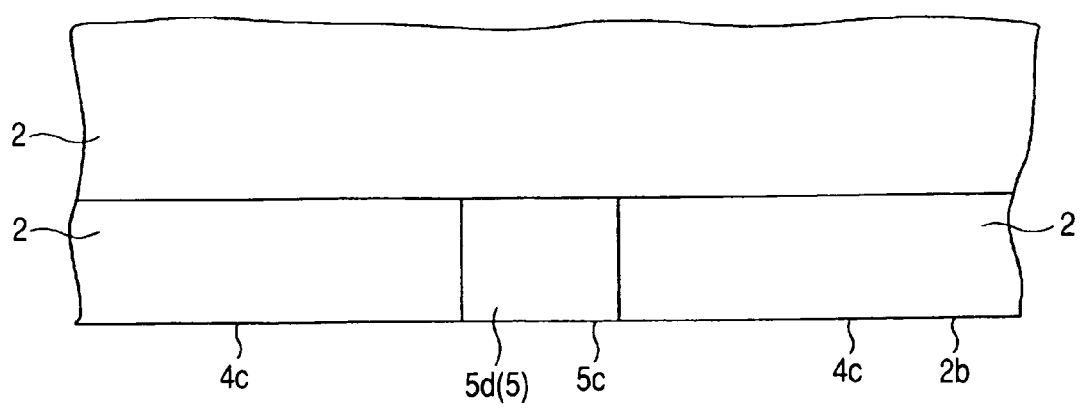
FIG. 30 is enlarged top view of a portion of the semiconductor device of FIG. 29.
Figure 31:
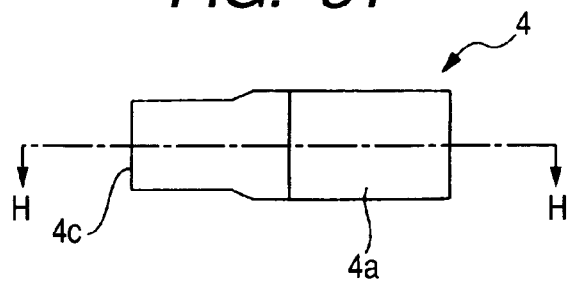
FIG. 31 is a plan view showing the configuration of a lead.
Figure 32:
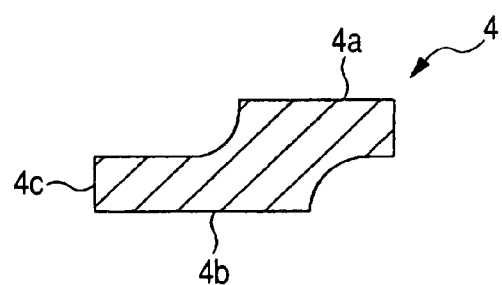
FIG. 32 is a cross-sectional view taken along line H-H in FIG. 31.

FIG. 29 is an enlarged side view of a portion of a semiconductor device according to another embodiment of the present invention. FIG. 30 is an enlarged top view of the vicinity of the peripheral portion of the semiconductor device of FIG. 29. FIG. 31 is a plan view showing the configuration of each of the leads 4 in the semiconductor device according to the present embodiment. FIG. 32 is a cross-sectional view taken along the line H-H of FIG. 31. FIG. 29 corresponds to FIG. 7 in the foregoing first embodiment. FIG. 30 corresponds to FIG. 8 in the foregoing first embodiment. FIG. 31 corresponds to a part of FIG. 11 in the foregoing first embodiment. FIG. 32 corresponds to FIG. 13 in the foregoing first embodiment.

In the present embodiment, the upper surfaces of the leads 4 are prevented from being exposed from the encapsulating resin portion 2 in the vicinity of the cut surfaces 4c of the leads 4, as shown in FIGS. 29 and 30. Specifically, the region of each of the leads 4 which is proximate to the cut surface 4c thereof is relatively thinned by performing half etching or the like with respect to the upper surface 4a of the lead 4 such that, when the encapsulating resin portion 2 is formed, the lower exposed surface 4b of the lead 4 is exposed at the back surface 2a of the encapsulating resin portion 2, while the upper surface of the lead 4 is not exposed from the encapsulating resin 2, as shown in FIGS. 31 and 32. At other points, the structure of the present embodiment is substantially the same as that of the foregoing first embodiment so that description thereof is omitted.

In the present embodiment, the upper exposed surfaces 5d of the leads 5 are exposed from the encapsulating resin portion 2, while the upper surfaces of the leads 4 are not exposed therefrom. Accordingly, the spacings between the upper exposed surfaces 5d of the leads 5 which are exposed from the encapsulating resin portion 2 can be increased. Consequently, even when the plate layer 9 formed over the upper exposed surfaces 5d of the leads 5 is crushed when the lead frame 21 is cut, a phenomenon in which the upper exposed surfaces 5d of the leads 5 are electrically connected to each other via the crushed plate layer can be suppressed or prevented. This can prevent the occurrence of a short circuit between the leads 4 and 5 and improve the reliability of the semiconductor device. Since the occurrence of a short circuit between the leads 4 and 5 via the crushed plate layer 9 can be prevented even when the spacings between the leads 4 and 5 are reduced, a miniaturized semiconductor device or a semiconductor device equipped with multiple terminals can be implemented. Since an electrolytic plate layer can be used as the plate layer 9, the manufacturing cost for the semiconductor device can be reduced.

Embodiment 3

Figure 33:
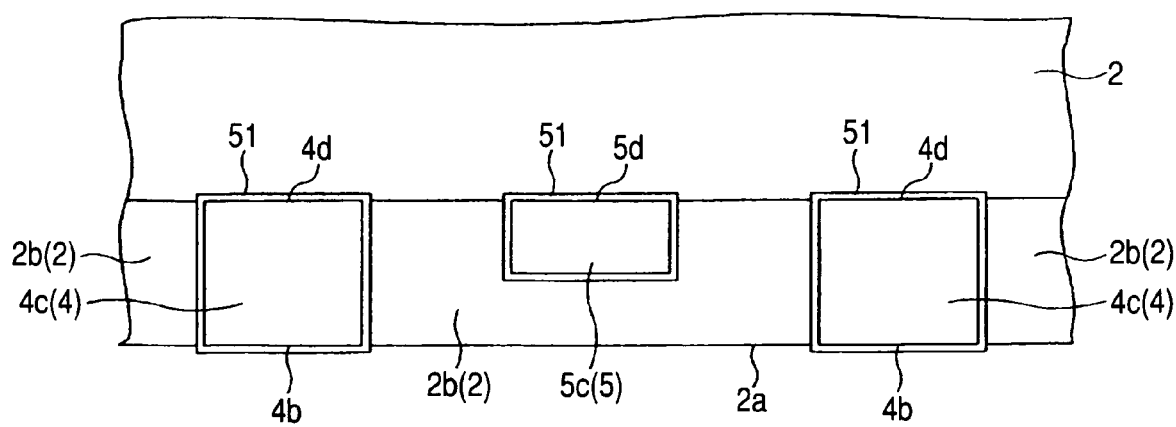
FIG. 33 is an enlarged side view of a portion of a semiconductor device according to still another embodiment of the present invention.

FIG. 33 is a partially enlarged side view of a semiconductor device according to still another embodiment of the present invention, which corresponds to FIG. 7 in the foregoing first embodiment.

In the present embodiment, the semiconductor device is manufactured by using a lead frame having a palladium (Pd) plate layer 51 formed over the surface (entire surface) thereof. Specifically, after the lead frame is formed by an etching or punching out process, the palladium plate layer 51 is formed over the entire surface of the lead frame. Thereafter, the semiconductor device is manufactured in the same manner as in the foregoing first embodiment except that a plating process (step corresponding to FIGS. 20 and 21) is not performed with respect to the lead frame after the formation of the encapsulating resin portion 2. Specifically, the semiconductor device is manufactured by mounting, after preparing the lead frame having the palladium plate layer 51 formed over the surface (entire surface) thereof, the semiconductor chip 3 on each of the tabs 7 of the lead frame as shown in FIG. 17, electrically connecting the plurality of electrodes 3a of the semiconductor chip 3 to the plurality of leads 4 and 5 of the lead frame via the plurality of bonding wires 6 as shown in FIG. 18, encapsulating the semiconductor chip 3, the bonding wires 6, the leads 4 and 5, and the tab 7 in the encapsulating resin portion 2 as shown in FIG. 19, and cutting away the unwanted portion of the lead frame as shown in FIG. 22 (FIG. 23).

In the present embodiment, the width $W_1$ of the upper exposed surface 4d of each of the leads 4 need not be adjusted to be smaller than the width $W_2$ of the lower exposed surface 4b thereof. For example, the width $W_1$ of the upper exposed surface 4d of the lead 4 can also be adjusted to be equal to the width $W_2$ of the lower exposed surface 4b thereof. At other points, the structure and manufacturing steps of the present embodiment are substantially the same as those of the foregoing first embodiment so that description thereof is omitted.

In the present embodiment, the palladium plate layer 51 is formed over the entire surface of the lead frame.

Consequently, the palladium plate layer 51 is formed over the lower exposed surfaces 4b and 5b of the leads 4 and 5 and the upper exposed surfaces 4d and 5d thereof, as can also be seen from FIG. 33. The palladium plate layer 51 has properties such that it is not only higher in hardness and less likely to be deformed than metals such as Sn and Au when the lead frame 21 is cut, as shown in FIG. 23, but also is higher in melting point than Sn and more resistant to oxidation than Cu. This makes it possible to use a lead frame having the palladium plate layer 51 formed preliminarily on the entire surface thereof at the stage prior to an assembly step after the formation of the lead frame. By thus performing a transfer molding step with respect to the lead frame preliminarily formed with the plate layer 51, the plate layer 51 formed over the upper exposed surfaces 4d and 5d has a structure in which at least a part thereof is buried in the encapsulated resin portion 2 so that the length of the portion of the plate layer 51 protruding from the encapsulating resin portion 2 is smaller than the film thickness of the plate layer 51. By reducing the length of the protruding portion of the plate layer 51, the amount of deformation of the plate layer 51 in the step of cutting the lead frame 21 is reduced. In other words, the phenomenon in which the plate layer formed over the upper exposed surfaces 4d and 5d of the leads 4 and 5 is crushed and extended as shown in FIG. 28 is less likely to occur in the palladium plate layer 51. Therefore, the phenomenon in which the adjacent upper exposed surfaces 4d and 5d of the leads 4 and 5 are electrically connected to each other via the plate layer (which is the palladium plate layer 51 herein) can be suppressed or prevented. This can prevent the occurrence of a short circuit between the adjacent leads 4 and 5 and improve the reliability of the semiconductor device.

Since the present embodiment has prevented the deformation of the plate layer during the cutting of the lead frame by forming the palladium plate layer 51 over the entire surface of the lead frame, the occurrence of a short circuit between the upper exposed surfaces 4d and 5d of the adjacent leads 4 and 5 can be prevented even when, unlike in the foregoing first embodiment, the width $W_1$ of the upper exposed surface 4d of each of the leads 4 is not adjusted to be smaller than the width $W_2$ of the lower exposed surface 4b thereof (e.g., when the width $W_1$ of the upper exposed surface 4d of the lead 4 is adjusted to be equal to the width $W_2$ of the lower exposed surface 4b thereof).

The present embodiment is not only applicable to a semiconductor device in which the lower exposed surfaces 4b and 5b of the leads 4 and 5 serving as the external terminals are arranged in a staggered configuration at the back surface 2a of the encapsulating resin portion 2, but also to a semiconductor device (semiconductor device in a QFN package configuration) in which the exposed surfaces of leads serving as external terminals are arranged in a single row at the peripheral region of the back surface 2a of the encapsulating resin portion 2. Even when the external terminals are in a single row arrangement, a short circuit may occur between the upper exposed surfaces of the leads if the pitch of the leads is low. By applying the present embodiment, however, it becomes possible to prevent the occurrence of a short circuit between the upper exposed surfaces of the leads and thereby improve the reliability of the semiconductor device.

Embodiment 4

Figure 34:
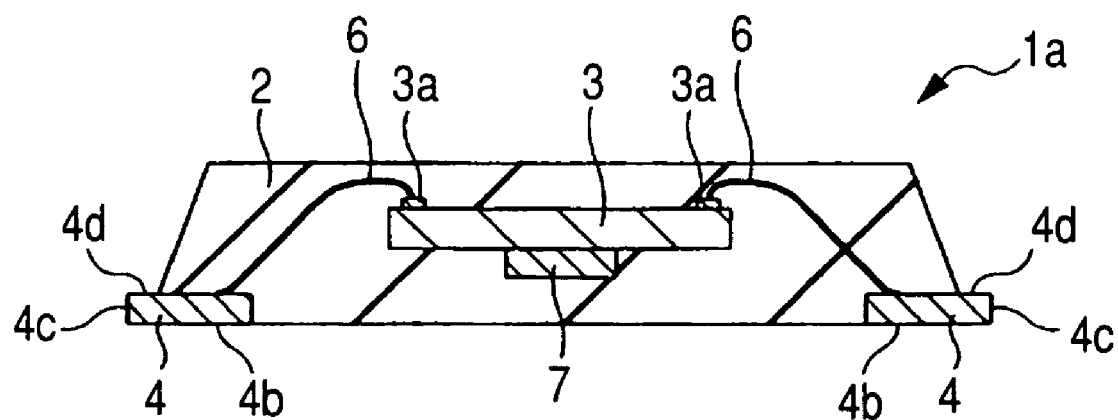
FIG. 34 is a cross-sectional view of a semiconductor device according to yet another embodiment of the present invention as seen in a manufacturing step.
Figure 35:
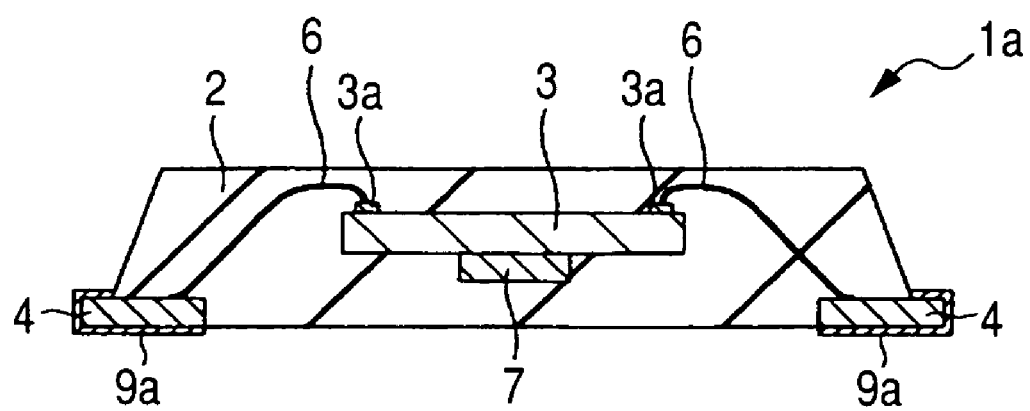
FIG. 35 is a cross-sectional view of the semiconductor device as seen in a manufacturing step subsequent to the step shown in FIG. 34.

FIGS. 34 and 35 are cross-sectional views illustrating the steps of manufacturing a semiconductor device according to yet another embodiment of the present invention. Since the steps illustrated in FIGS. 17 to 19 are substantially the same as those in the foregoing first embodiment, a description thereof will be omitted and the manufacturing steps which are implemented subsequent to the step of FIG. 19 will be described.

After forming the encapsulating resin portion 2, as shown in FIG. 19, the present embodiment cuts the lead frame 21, as shown in FIG. 34, before forming the plate layer 9, thereby providing the individually separated semiconductor devices 1a. The step of cutting the lead frame 21 can be performed in the same manner as in the foregoing first embodiment (see FIGS. 23 to 25).

Next, as shown in FIG. 35, a plate layer 9a is formed over the portions (which are the lower exposed surfaces 4b and 5b, the cut surfaces 4c and 5c, and the upper exposed surfaces 4d and 5d herein) of the leads 4 and 5 of each of the individually separated semiconductor devices 1a which are exposed from the encapsulating resin portion 2. The plate layer 9a may be formed by, e.g., electrolytic plating. For example, the plate layer 9a may also be composed of a tin (Sn) plate layer formed by electrolytic plating.

In the present embodiment, the width $W_1$ of the upper exposed surface 4d of each of the leads 4 need not be adjusted to be smaller than the width $W_2$ of the lower exposed surface 4b thereof. For example, the width $W_1$ of the upper exposed surface 4d of the lead 4 can also be adjusted to be equal to the width $W_2$ of the lower exposed surface 4b thereof. At other points, the structure and manufacturing steps of the present embodiment are substantially the same as those of the foregoing first embodiment so that a description thereof is omitted.

Since the plate layer 9a is not present in the present embodiment as shown in FIG. 34, there occurs no such phenomenon in which the adjacent upper exposed surfaces 4d and 5d of the leads 4 and 5 are electrically connected to each other via the plate layer which was crushed when the lead frame 21 was cut. This can prevent the occurrence of a short circuit between the adjacent leads 4 and 5 and improve the reliability of the semiconductor device.

Since the present embodiment has prevented the deformation of the plate layer during the cutting of the lead frame 21 by forming the plate layer 9a after cutting the lead frame 21, the occurrence of a short circuit between the upper exposed surfaces 4d and 5d of the adjacent leads 4 and 5 can be prevented even when, unlike in the foregoing first embodiment, the width $W_1$ of the upper exposed surface 4d of each of the leads 4 is not adjusted to be smaller than the width $W_2$ of the lower exposed surface 4b thereof (e.g., when the width $W_1$ of the upper exposed surface 4d of the lead 4 is adjusted to be equal to the width $W_2$ of the lower exposed surface 4b thereof).

The present embodiment is not only applicable to the semiconductor device in which the lower exposed surfaces 4b and 5b of the leads 4 and 5 serving as the external terminals are arranged in a staggered configuration at the back surface 2a of the encapsulating resin portion 2, but also to a semiconductor device (semiconductor device in a QFN package configuration) in which the exposed surfaces of leads serving as external terminals are arranged in a single row at the peripheral region of the back surface 2a of the encapsulating resin portion 2. Even when the external terminals are in a single row arrangement, a short circuit may occur between the upper exposed surfaces of the leads if the pitch of the leads is low. By applying the present embodiment, however, it becomes possible to prevent the occurrence of a short circuit between the upper exposed surfaces of the leads and thereby improve the reliability of the semiconductor device.

Embodiment 5

Figure 36:
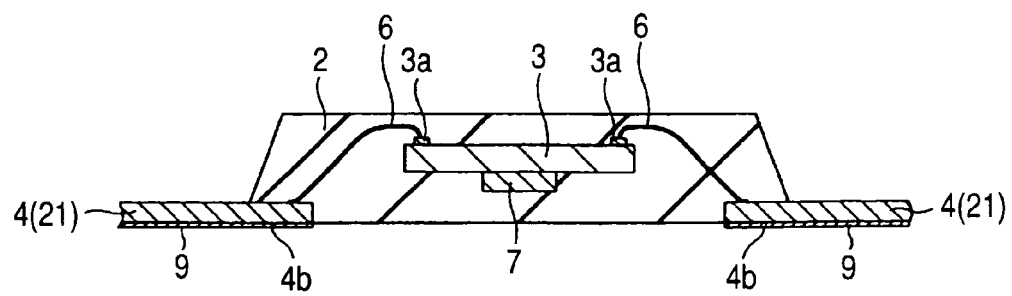
FIG. 36 is a cross-sectional view of a semiconductor device according to still another embodiment of the present invention as seen in a manufacturing step.
Figure 37:
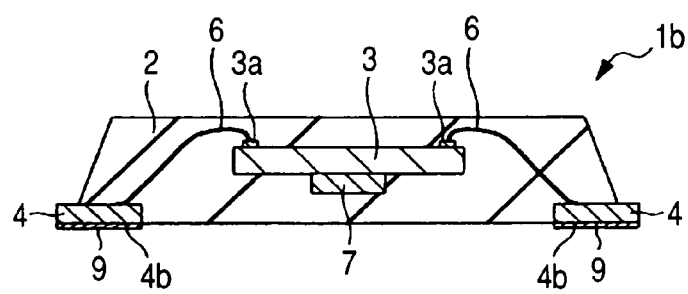
FIG. 37 is a cross-sectional view of the semiconductor device as seen in a manufacturing step subsequent to the step shown in FIG. 36.
Figure 38:
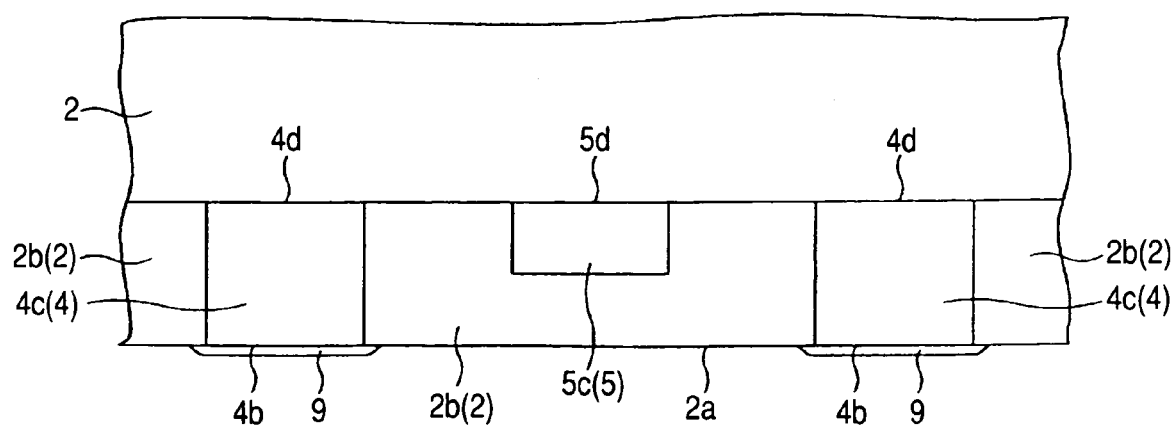
FIG. 38 is an enlarged side view of a portion of the semiconductor device according to the other embodiment of the present invention.

FIGS. 36 and 37 are cross-sectional views illustrating the steps of manufacturing a semiconductor device according to still another embodiment of the present invention. Since the steps illustrated in FIGS. 17 to 19 are substantially the same as in the foregoing first embodiment, a description thereof will be omitted and the manufacturing steps which are implemented subsequent to the step of FIG. 19 will be described. FIG. 38 is a partially enlarged side view of the semiconductor device according to the present embodiment, which corresponds to FIG. 7 in the foregoing first embodiment.

After forming the encapsulating resin portion 2 as shown in FIG. 19, the present embodiment forms the plate layer 9 over the lower exposed surfaces 4b and 5b of the portions of the leads 4 and 5 which are exposed from the encapsulating resin portion 2, but does not form the plate layer over the upper exposed surfaces 4d and 5d, as shown in FIG. 36. In other words, the plate layer 9 is formed on the principal surface of the lead frame which is opposite to the principal surface thereof formed with the encapsulating resin portion 2, while the plate layer 9 is not formed on the principal surface of the lead frame formed with the encapsulating resin portion 2. The structure can be implemented by forming the plate layer 9 only over the conductor portion exposed at the back surface 2a of the encapsulating resin portion 2 when the plate layer 9 is formed through the process of, e.g., covering the lead frame 21 formed with the encapsulating resin portion 2 with a mask and spraying a solder plate solution or the like in a showery manner onto only the portion of the back surface 2a of the encapsulating resin portion 2 which is exposed in the opening of the mask and the vicinity thereof.

Then, the lead frame 21 is cut as shown in FIG. 37 to obtain the individually separated semiconductor devices 1b. The step of cutting the lead frame 21 may also be performed in the same manner as in the foregoing first embodiment (FIGS. 23 to 25).

In the present embodiment, the width $W_1$ of the upper exposed surface 4d of each of the leads 4 need not be adjusted to be smaller than the width $W_2$ of the lower exposed surface 4b thereof. For example, the width $W_1$ of the upper exposed surface 4d of the lead 4 can also be adjusted to be equal to the width $W_2$ of the lower exposed surface 4b thereof. At other points, the structure and manufacturing steps of the present embodiment are substantially the same as those of the foregoing first embodiment so that a description thereof is omitted herein.

In the present embodiment, the plate layer 9 is formed over the lower exposed surfaces 4b and 5b of the leads 4 and 5, while the plate layer 9 is not formed over the upper exposed surfaces 4d and 5d thereof, as can also be seen from FIG. 38. Since the plate layer 9 is not formed over the upper exposed surfaces 4d and 5d of the leads 4 and 5, there occurs no such phenomenon in which the plate layer is crushed when the lead frame 21 is cut and the adjacent upper exposed surfaces 4d and 5d of the leads 4 and 5 are electrically connected to each other via the plate layer. This can prevent the occurrence of a short circuit between the adjacent leads 4 and 5 and improve the reliability of the semiconductor device.

Since in the present embodiment it is possible to prevent the deformation of the plate layer during the cutting of the lead frame by forming the plate layer 9 only over the lower exposed surfaces 4b and 5b of the leads 4 and 5 functioning as external terminals without forming the plate layer 9 over the upper exposed surfaces 4d and 5d of the leads 4 and 5, the occurrence of a short circuit between the upper exposed surfaces 4d and 5d of the adjacent leads 4 and 5 can be prevented even when, unlike in the foregoing first embodiment, the width $W_1$ of the upper exposed surface 4d of each of the leads 4 is not adjusted to be smaller than the width $W_2$ of the lower exposed surface 4b thereof (e.g., when the width $W_1$ of the upper exposed surface 4d of the lead 4 is adjusted to be equal to the width $W_2$ of the lower exposed surface 4b thereof).

The present embodiment is not only applicable to a semiconductor device in which the lower exposed surfaces 4b and 5b of the leads 4 and 5 serving as the external terminals are arranged in a staggered configuration at the back surface 2a of the encapsulating resin portion 2, but also to a semiconductor device (semiconductor device in a QFN package configuration) in which the exposed surfaces of leads serving as external terminals are arranged in a single row at the peripheral region of the back surface 2a of the encapsulating resin portion 2. Even when the external terminals are in a single row arrangement, a short circuit may occur between the upper exposed surfaces of the leads if the pitch of the leads is low. By applying the present embodiment, however, it becomes possible to prevent the occurrence of a short circuit between the upper exposed surfaces of the leads and thereby improve the reliability of the semiconductor device.

Embodiment 6

Figure 39:
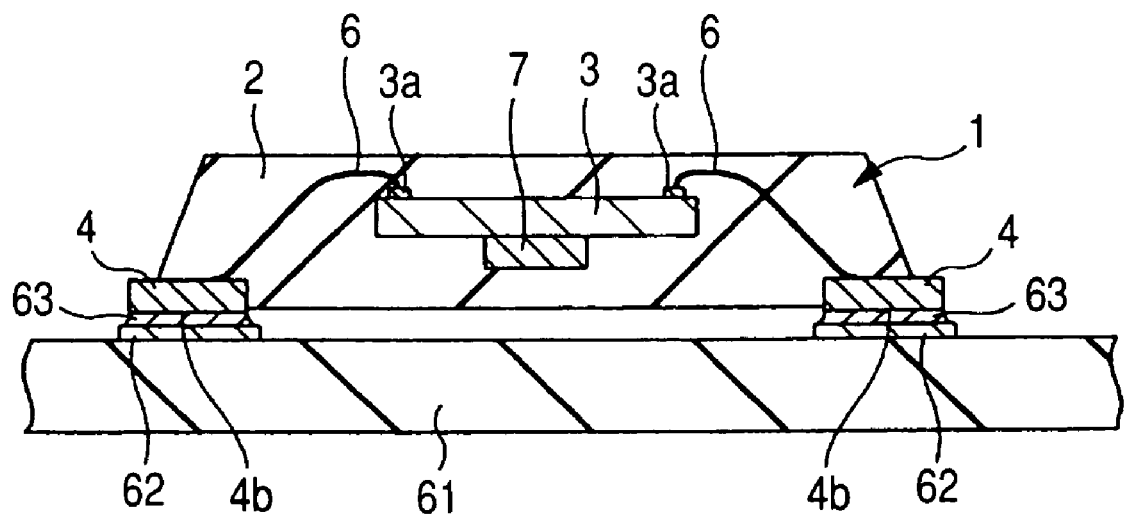
FIG. 39 is a cross-sectional view showing a state in which the semiconductor device is mounted on a substrate.
Figure 40:
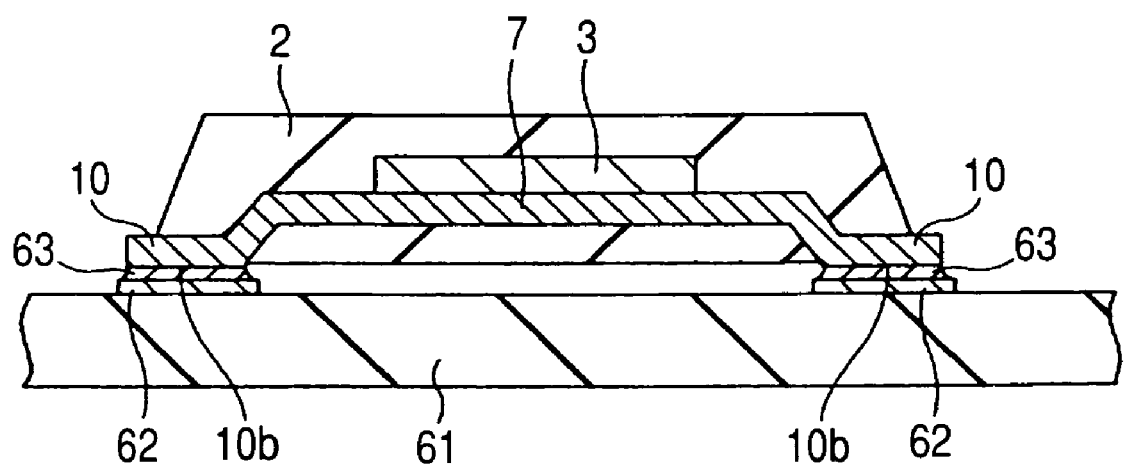
FIG. 40 is a cross-sectional view showing a state in which the semiconductor device is mounted on the substrate.

FIGS. 39 and 40 are cross-sectional views showing the state in which the semiconductor device 1 according to the foregoing first embodiment is mounted on a substrate 61, in which FIG. 39 is a cross-sectional view corresponding to FIG. 1 of the foregoing embodiment and FIG. 40 is a cross-sectional view corresponding to FIG. 6 of the foregoing first embodiment.

Since the structure of the semiconductor device 1 is substantially the same as in the foregoing first embodiment, a description thereof will be omitted herein and an example of the connecting relationship between the semiconductor device 1 and the substrate (external substrate or motherboard) 61 will be described. When the semiconductor device 1 is mounted on the substrate 61, the lower exposed surfaces 4b and 5b of the leads 4 and 5 serving as the external terminals of the semiconductor device 1 are connected (joined) to a conductor pattern (terminals or conductor portion) 62 formed on the substrate 61 via conductive joining materials 63 made of a solder or the like, as shown in FIG. 39. In the present embodiment, the lower exposed surfaces 10b of the suspended leads 10 of the semiconductor device 1 are also connected to the terminals or conductor pattern 62 formed on the substrate 61 via the joining materials 63, as shown in FIG. 40.

As shown in FIG. 3, the area of each of the external terminals (lower exposed surfaces 4b and 5b) is relatively small in the semiconductor device in which the external terminals (lower exposed surfaces 4b and 5b) are arranged in a staggered configuration at the back surface thereof so that the joining strength (connecting strength) between each of the external terminals (lower exposed surfaces 4b and 5b) and the substrate 61 is not so large when the semiconductor device is mounted on the substrate 61. The present embodiment not only connects the lower exposed surfaces 4b and 5b serving as the external terminals of the semiconductor device 1 to the conductor pattern 62 on the substrate 61, but also connects the lower exposed surfaces 10b of the suspended leads 10, which are not electrically connected to the semiconductor chip 3, to the conductor pattern 62 on the substrate 61. By connecting also the lower exposed surfaces 10b of the suspended leads 10 to the conductor pattern 62 on the substrate 61, the mounting of the semiconductor device 1 to the substrate 61 can be reinforced and the semiconductor device 1 can reliably be fixed to the substrate 61. Even when the semiconductor device 1 or the substrate 61 warps due to temperature variations in an ambient environment or the like, therefore, it becomes possible to prevent the lower exposed surfaces 4b and 5b as the external terminals of the semiconductor device 1 from coming off the conductor pattern 62 on the substrate 61. Accordingly, the reliability with which the semiconductor device 1 is mounted on the substrate can be improved. Since the lower exposed surfaces 10b of the suspended leads 10 are located at the four corners of the back surface of the semiconductor device 1 and the lower exposed surfaces 10b at the four corners thereof are connected to the conductor pattern 62 on the substrate 61, the effect of improving the reliability with which the semiconductor device 1 is mounted on the substrate is high.

Embodiment 7

Figure 41:
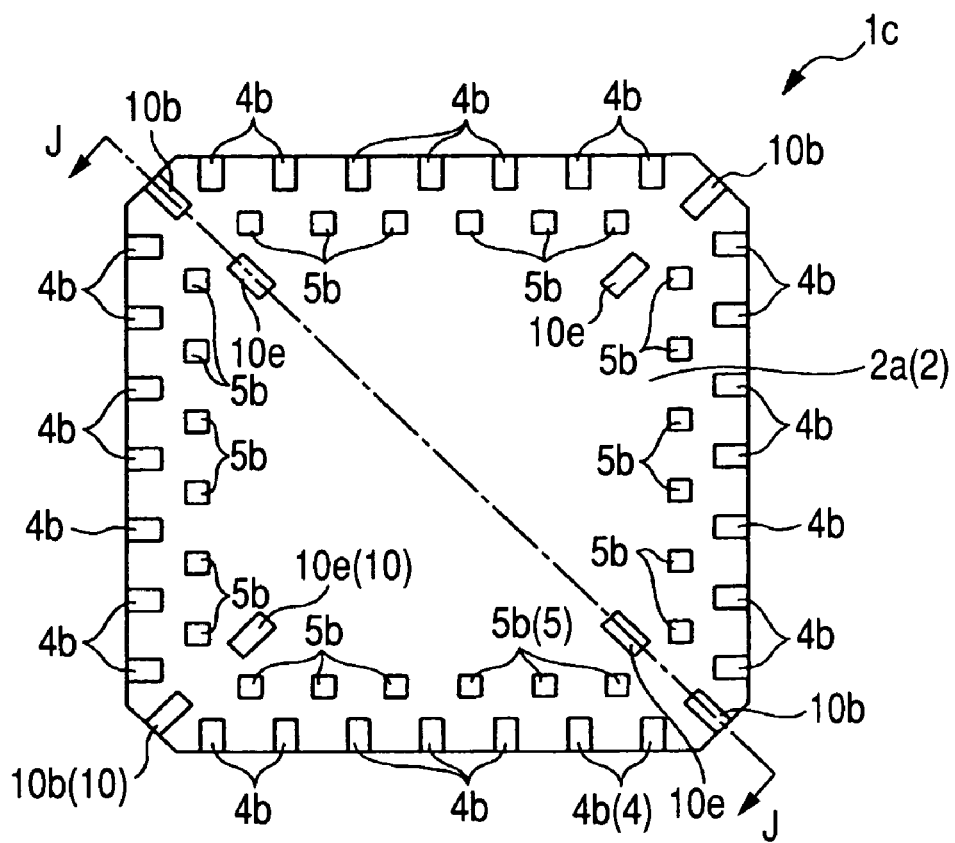
FIG. 41 is a bottom view of a semiconductor device according to yet another embodiment of the present invention.
Figure 42:
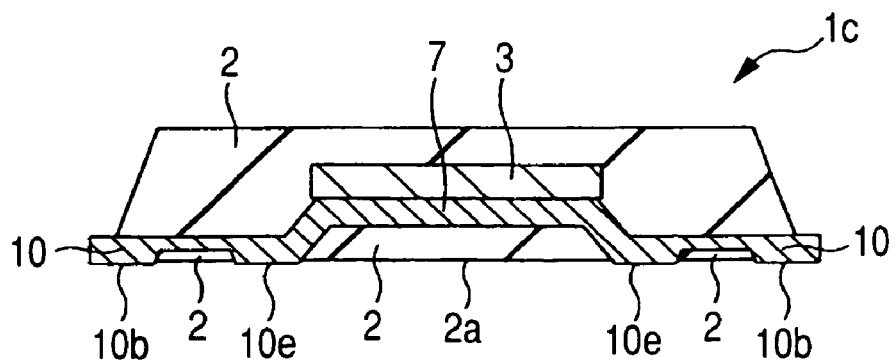
FIG. 42 is a cross-sectional view taken along line J-J in FIG. 41.
Figure 43:
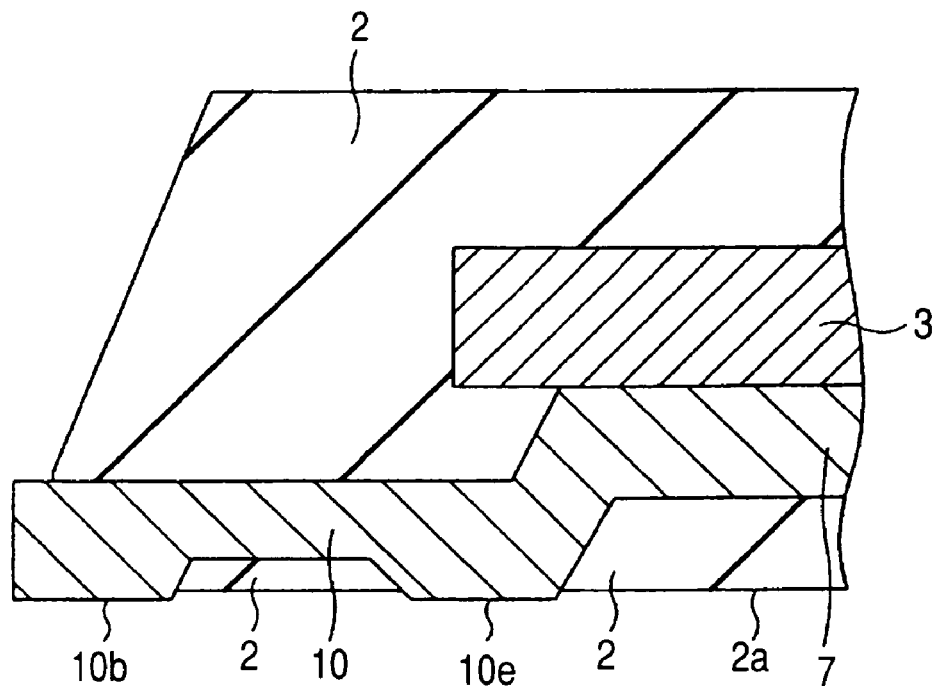
FIG. 43 is an enlarged cross-sectional view of a portion of the semiconductor device of FIG. 41.

FIG. 41 is a bottom view (back face view) of a semiconductor device according to yet another embodiment of the present invention. FIG. 42 is a cross-sectional view of the semiconductor device of FIG. 41 and FIG. 43 is a partially enlarged cross-sectional view thereof. A cross section taken along the line J-J of FIG. 41 substantially corresponds to FIG. 42. FIG. 43 shows the same cross section as shown in FIG. 42. FIG. 41 corresponds to FIG. 3 in the foregoing first embodiment. FIG. 42 corresponds to FIG. 6 in the foregoing first embodiment.

In the foregoing first embodiment, each of the lower exposed surfaces 10b of the suspended leads 10 has only one portion exposed at the back surface 2a of the encapsulating resin portion 2. In the present embodiment, by contrast, the lower surface of each of the suspended leads 10 has a plurality of portions, e.g., two portions exposed at the back surface 2a of the encapsulating resin portion 2.

In the semiconductor device 1c according to the present embodiment shown in FIGS. 41 to 43, each of the suspended leads 10 having one of the ends thereof connected to the four corners of the tab 7 and extending outwardly of the tab 7 has a plurality of portions, which represented two portions herein, exposed at the bottom surface 2a of the encapsulating resin portion 2, unlike in the foregoing first embodiment. That is, in the present embodiment, each of the suspended leads 10 has a lower exposed surface (outer exposed surface) 10b exposed at the regions of the back surface 2a of the encapsulating resin portion 2 which are proximate to the four corners thereof and a lower exposed surface (inner exposed surface) 10e exposed at the portion of the back surface 2a which is located inward of (inner than) the lower exposed surface 10b. In the present embodiment, the region of each of the suspended leads 10 which is located between the lower exposed surfaces 10b and 10e thereof has a thickness relatively that is reduced (which is smaller than the thickness of each of the lower exposed surfaces 10b and 10e) by performing half etching or the like with respect to the lower surface thereof. In another embodiment, it is also possible to elevate the region located between the lower exposed surfaces 10b and 10e so that it is higher in level than the lower exposed surfaces 10b and 10e by providing each of the suspended leads 10 with a bent portion. At other points, the structure of the present embodiment is substantially the same as that of the foregoing first embodiment so that a description thereof is omitted herein.

Figure 44:
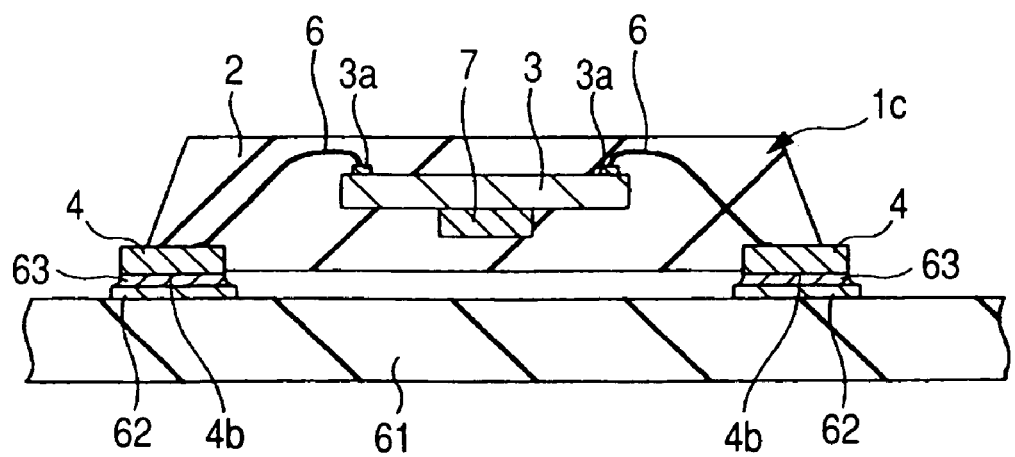
FIG. 44 is a cross-sectional view showing a state in which the semiconductor device of FIG. 41 is mounted on a substrate.
Figure 45:
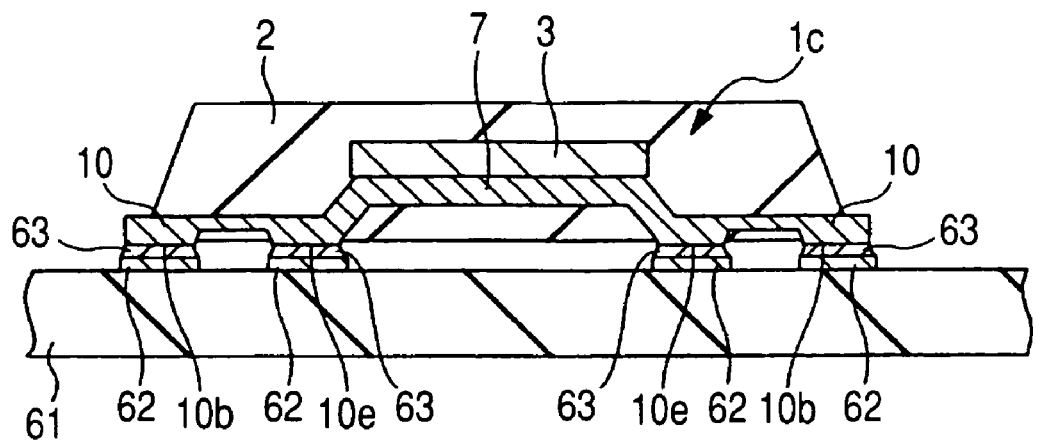
FIG. 45 is a cross-sectional view showing a state in which the semiconductor device of FIG. 41 is mounted on the substrate.

FIGS. 44 and 45 are cross-sectional views each showing the state in which a semiconductor device 1c according to the present embodiment is mounted on the substrate (external substrate or motherboard) 61, in which FIG. 44 is a cross-sectional view corresponding to FIG. 4 of the foregoing first embodiment and FIG. 45 is a cross-sectional view corresponding to FIG. 42.

When the semiconductor device 1c is mounted on the substrate 61, the lower exposed surfaces 4b and 5b of the leads 4 and 5 serving as the external terminals of the semiconductor device 1c are connected (joined) to the conductor pattern (terminals or conductor portion) 62 formed on the substrate 61 via the conductive joining materials 63 made of a solder or the like, as shown in FIG. 44. In the present embodiment, the lower exposed surfaces 10b and 10e of the suspended leads 10 of the semiconductor device 1c are also connected to the conductor pattern 62 formed on the substrate 61 via the joining materials 63, as shown in FIG. 45.

As shown in FIG. 41, the area of each of the external terminals (lower exposed surfaces 4b and 5b) is relatively small in the semiconductor device in which the external terminals (lower exposed surfaces 4b and 5b) are arranged in a staggered configuration at the back surface thereof so that the joining strength (connecting strength) between each of the external terminals (lower exposed surfaces 4b and 5b) and the substrate 61 is not so large when the semiconductor device is mounted on the substrate 61.

In the present embodiment, the lower surface of each of the suspended leads 10 has a plurality of portions exposed from the back surface 2a of the encapsulating resin portion 2, which are the two lower exposed surfaces 10b and 10e herein. In mounting the semiconductor device 1c on the substrate 61, the present embodiment not only connects the lower exposed surfaces 4b and 5b serving as the external terminals of the semiconductor device 1c to the conductor pattern 62 on the substrate 61, but also connects the lower exposed surfaces 10b and 10e of the suspended leads 10, which are not electrically connected to the semiconductor chip 3, to the conductor pattern 62 on the substrate 61. By connecting also the lower exposed surfaces 10b and 10e of the suspended leads 10 to the conductor pattern 62 on the substrate 61, the mounting of the semiconductor device 1c to the substrate 61 can be reinforced and the semiconductor device 1c can reliably be fixed to the substrate 61. Even when the semiconductor device 1c or the substrate 61 warps due to temperature variations in an ambient environment or the like, therefore, it becomes possible to prevent the lower exposed surfaces 4b and 5b serving as the external terminals of the semiconductor device 1c from coming off the conductor pattern 62 on the substrate 61. Accordingly, the reliability with which the semiconductor device 1c is mounted on the substrate can be improved. Since the lower exposed surfaces 10b and 10e of the leads 10 are located at the four corners of the back surface of the semiconductor device 1c and at the inward (inner) region thereof and the lower exposed surfaces 10b and 10e can be connected to the conductor pattern 62 on the substrate 61, the effect of improving the reliability with which the semiconductor device 1c is mounted on the substrate is high. Since each of the suspended leads 10 has a plurality of portions exposed from the back surface 2a of the encapsulating resin portion 2, which are the two lower exposed surfaces 10b and 10e herein, the number of joints between the suspended leads 10 and the conductor pattern 62 on the substrate 61 can be increased. This further enhances the effect of improving the reliability with which the semiconductor device 1c is mounted on the substrate.

If the region of the lower surface of each of the suspended leads 10 located between the lower exposed surfaces 10b and 10e thereof is also exposed from the back surface of the encapsulating resin portion 2, the exposed surfaces of the suspended leads 10 and the lower exposed surfaces 5b of the leads 5 are brought into close proximity so that a short circuit may occur therebetween via the joining materials 63 or the like. Since the present embodiment has prevented the region of the lower surface of each of the suspended leads 10 interposed between the lower exposed surfaces 10b and 10e thereof from being exposed from the back surface of the encapsulating resin portion 2 and has encapsulated the interposed region in the encapsulating resin portion 2, it becomes possible to prevent the occurrence of a short circuit between the suspended leads 10 and the leads 4 and 5 and to further improve the reliability of the semiconductor device.

Figure 46:
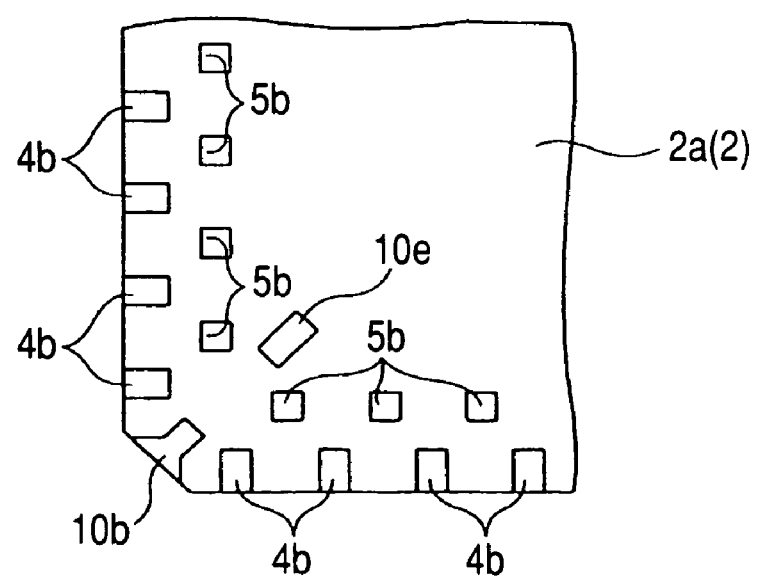
FIG. 46 is an enlarged bottom view of a portion of a semiconductor device according to still another embodiment of the present invention.
Figure 47:
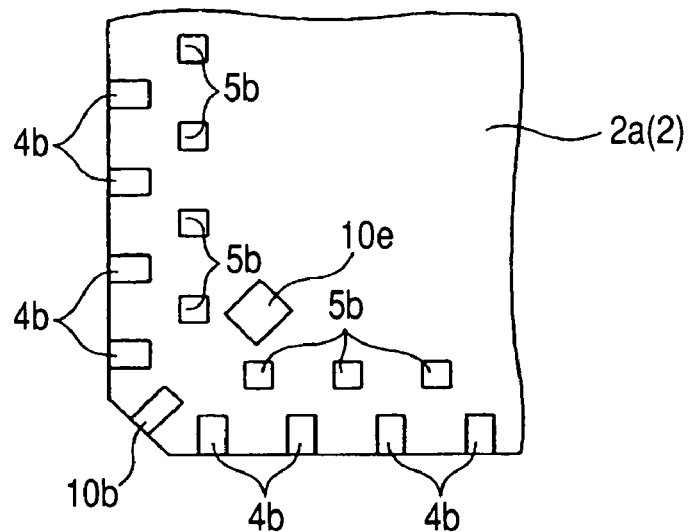
FIG. 47 is an enlarged bottom view of a portion of a semiconductor device according to yet another embodiment of the present invention.

Although the area of the lower exposed surface 10b of each of the suspended leads 10 is substantially equal to the area of the lower exposed surface 10e thereof in FIG. 41, the respective areas of the lower exposed surfaces 10b and 10e of each of the suspended leads 10 can be changed variously. FIG. 46 is a partially enlarged bottom view of a semiconductor device according to still another embodiment of the present invention. FIG. 47 is a partially enlarged bottom view of a semiconductor device according to yet another embodiment of the present invention. As shown in FIG. 46, the lower exposed surface 10b of each of the suspended leads 10 can be formed to be larger than each of the lower exposed surfaces 4b and 5b and the area of the lower exposed surface 10b can be adjusted to be larger than the area of the lower exposed surface 10e. It is also possible to form the lower exposed surface 10e of each of the suspended leads 10 to be larger than each of the lower exposed surfaces 4b and 5b.

Embodiment 8

Figure 48:
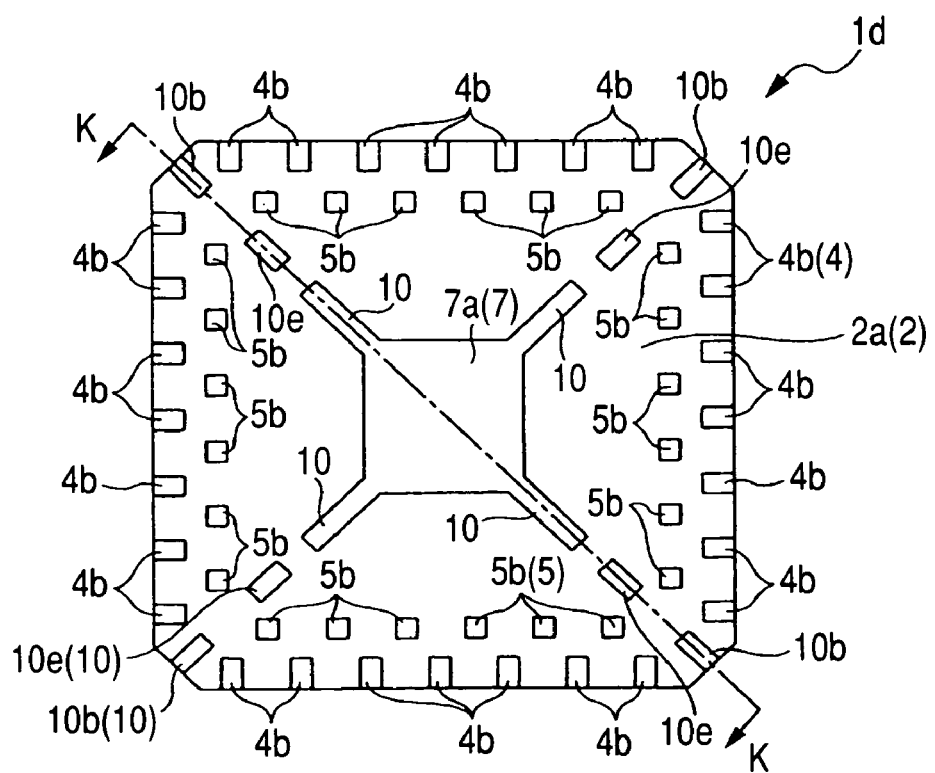
FIG. 48 is a bottom view of a semiconductor device according to still another embodiment of the present invention.
Figure 49:
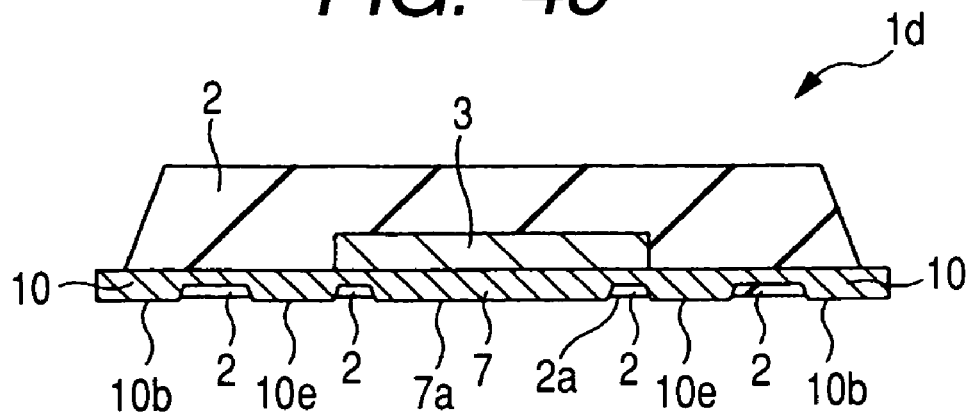
FIG. 49 is a cross-sectional view taken along line K-K in FIG. 47.
Figure 50:
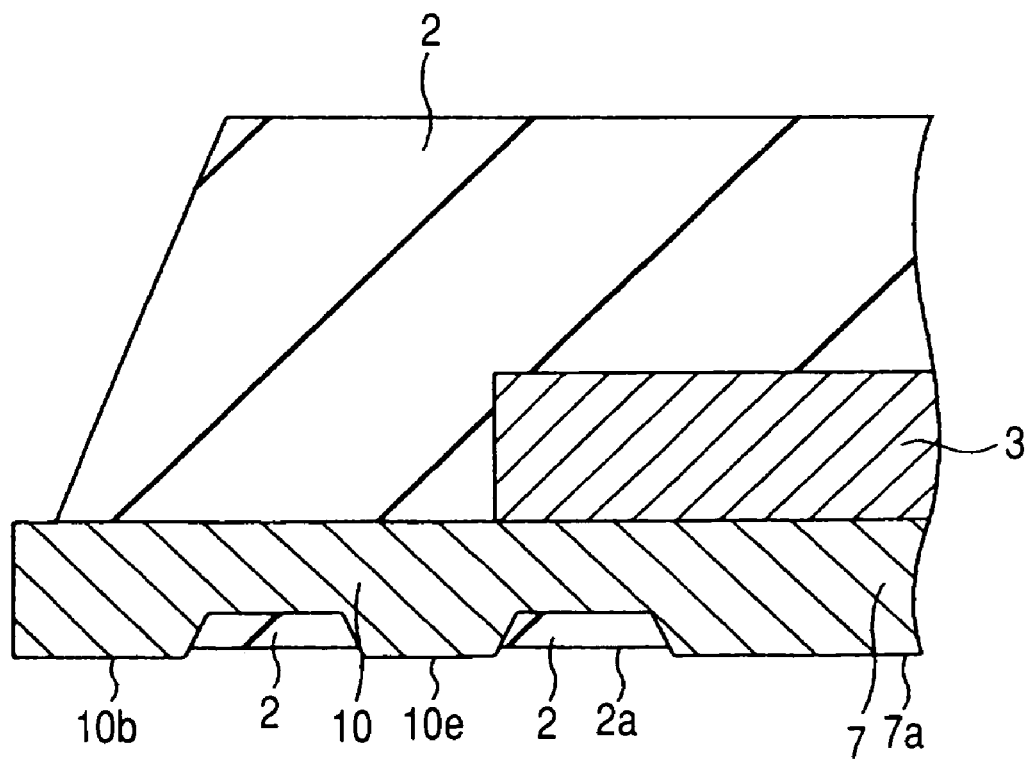
FIG. 50 is an enlarged cross-sectional view of a portion of the semiconductor device of FIG. 47.

FIG. 48 is a bottom view (back face view) of a semiconductor device according to still another embodiment of the present invention. FIG. 49 is a cross-sectional view of the semiconductor device of FIG. 48 and FIG. 50 is a partially enlarged cross-sectional view thereof. A cross section taken along the line K-K of FIG. 48 substantially corresponds to FIG. 49. FIG. 50 shows the same cross section as shown in FIG. 49. FIGS. 48 to 50 correspond to FIGS. 41 to 43, respectively.

In a semiconductor device 1d according to the present embodiment, as shown in FIGS. 48 to 50, the lower exposed surfaces 10b and 10e of each of the suspended leads 10 are exposed from the back surface 2a of the encapsulating resin portion 2 in the same manner as in the foregoing seventh embodiment and, in addition, the lower surface 7a of the tab 7 is also exposed from the back surface 2a of the encapsulating resin portion 2. That is, the present embodiment has formed each of the suspended leads 10 without providing it with the bent portion (bent portion 10a) such that the lower exposed surfaces 10b and 10e of the suspended lead 10 and the lower surface 7a of the tab 7 are present in substantially the same plane, while exposing the lower exposed surfaces 10b and 10e of the suspended lead 10, the lower surface 7a of the tab 7, and the region of the suspended lead 10 located in proximity to the tab 7 at the back surface 2a of the encapsulating resin portion 2. In the present embodiment, the region of each of the suspended leads 10 which is located between the lower exposed surfaces 10b and 10e thereof has a thickness that is relatively reduced (which is smaller than the thickness of each of the lower exposed surfaces 10b and 10e of the suspended leads) by performing half etching or the like with respect to the lower surface thereof. At other points, the structure of the semiconductor device 1d according to the present embodiment is substantially the same as that of the semiconductor device 1c according to the foregoing seventh embodiment so that a description thereof is omitted herein.

The semiconductor device 1d according to the present embodiment can also be mounted on the substrate 61 similar to the semiconductor device 1c according to the foregoing seventh embodiment, though it is not depicted. In this case, it is allowed in the present embodiment also in the same manner as in the foregoing seventh embodiment to not only expose the plurality of portions of each of the suspended leads 10, which are the lower exposed surfaces 10b and 10e, from the back surface 2a of the encapsulating resin portion 2 and connect (bond) the lower exposed surfaces 4b and 5b as the external terminals of the semiconductor device 1d to the conductor pattern 62 on the substrate 61 via the joining materials 63, but also to connect the lower exposed surfaces 10b and 10e of each of the suspended leads 10, which are not electrically connected to the semiconductor chip 3, to the conductor pattern 62 on the substrate 61 via the joining materials 63. It is also allowed to further connect the lower surface 7a of the tab 7 exposed at the back surface 2a of the encapsulating resin portion 2 to the conductor pattern 62 on the substrate 61 via the joining materials 63. By connecting the lower exposed surfaces 10b and 10e of the suspended leads 10 and also the lower surface 7a of the tab 7 to the conductor pattern 62 on the substrate 61, the mounting of the semiconductor device 1d on the substrate 61 can be reinforced and the semiconductor device 1d can be more reliably fixed to the substrate. Even when the semiconductor device 1d or the substrate 61 warps due to temperature variations in an ambient environment or the like, therefore, it becomes possible to more reliably prevent the lower exposed surfaces 4b and 5b serving as the external terminals of the semiconductor device 1d from coming off the conductor pattern 62 on the substrate 61. Accordingly, the reliability with which the semiconductor device 1d is mounted on the substrate can be further improved.

Although specific embodiments of the invention achieved by the present inventors have thus been described, the present invention is not limited to the foregoing embodiments. It will be easily appreciated that various other changes and modifications can be made without departing from the gist thereof.

For example, the present invention is effective when applied to a semiconductor device in a QFN package configuration.

What is claimed is:

1. A semiconductor device comprising:
   a semiconductor chip having a plurality of electrodes on a main surface thereof;
   a chip mounting portion for mounting said semiconductor chip;
   a plurality of lead portions being arranged around said chip mounting portion to surround said semiconductor chip and being separated with said chip mounting portion;
   a plurality of suspending lead portions being arranged at corners of said semiconductor chip and being continuously formed with said chip mounting portion;
   a plurality of wires electrically connecting said plurality of lead portions to said plurality of electrodes of said semiconductor chip;
   an encapsulating resin portion for encapsulating said semiconductor chip, said chip mounting portion, said plurality of wires, said plurality of lead portions, and said plurality of suspending lead portions,
   wherein a rear surface of said chip mounting portion is exposed from a mounting surface of said encapsulating resin portion to provide a solder connection with a mounting substrate,
   wherein each of said lead portions has a first exposed surface having a lower surface thereof exposed at said mounting surface of said encapsulating resin portion to provide a solder connection with said mounting substrate, wherein each of said suspending lead portion has second and third exposed surfaces each having a lower surface thereof exposed at said mounting surface of said encapsulating resin portion to provide a solder connection with said mounting substrate, wherein said second and third exposed surfaces of each of said suspending lead portions are separated from each other in an extended direction of said suspending lead portion, wherein said encapsulating resin portion has a substantially tetragonal shape in a plan view, wherein said second exposed surfaces of each of said suspending lead portions are located between adjacent ones of said plurality lead portions at four corners of said encapsulating resin portion, and wherein said second exposed surfaces of each of said suspending lead portions are located inside of said first exposed surfaces of said lead portions.

2. A semiconductor device according to claim 1 wherein said semiconductor chip has a substantially tetragonal shape in a plan view and wherein said suspending lead portions are respectively arranged at four corners of said semiconductor chip.

* * * * *